(12) United States Patent
Lee

(10) Patent No.: US 11,251,192 B2
(45) Date of Patent: Feb. 15, 2022

(54) SEMICONDUCTOR DEVICES AND MANUFACTURING METHODS OF THE SAME

(71) Applicant: SAMSUNG ELECTRONICS CO., LTD., Suwon-si (KR)

(72) Inventor: So Hyeon Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 64 days.

(21) Appl. No.: 16/386,740

(22) Filed: Apr. 17, 2019

(65) Prior Publication Data

US 2019/0378857 A1 Dec. 12, 2019

(30) Foreign Application Priority Data

Jun. 11, 2018 (KR) .................. 10-2018-0066815

(51) Int. Cl.
*H01L 27/11* (2006.01)
*H01L 27/11582* (2017.01)
(Continued)

(52) U.S. Cl.
CPC ...... *H01L 27/11582* (2013.01); *H01L 23/528* (2013.01); *H01L 23/5226* (2013.01); *H01L 27/11521* (2013.01); *H01L 27/11556* (2013.01); *H01L 27/11568* (2013.01); *H01L 29/41775* (2013.01); *H01L 29/4234* (2013.01); *H01L 29/42324* (2013.01); *H01L 21/02532* (2013.01); *H01L 21/02636* (2013.01); *H01L 21/31111* (2013.01); *H01L 21/31155* (2013.01); *H01L 21/76802* (2013.01); *H01L 21/76877* (2013.01); *H01L 21/76897* (2013.01); *H01L 29/40114* (2019.08); *H01L 29/40117* (2019.08); *H01L 29/66545* (2013.01); *H01L 29/7883* (2013.01)

(58) Field of Classification Search
CPC combination set(s) only.
See application file for complete search history.

(56) References Cited

U.S. PATENT DOCUMENTS 4,956,314 A 9/1990 Tam et al.
7,501,355 B2 3/2009 Bhatia et al.
(Continued)

FOREIGN PATENT DOCUMENTS

JP 2015-170692 9/2015
KR 10-1511764 4/2015
KR 10-2016-0013756 2/2016

*Primary Examiner* — Moin M Rahman
(74) *Attorney, Agent, or Firm* — F. Chau & Associates, LLC

(57) ABSTRACT

A semiconductor device includes a vertical stack of gate electrodes. The gate electrodes extend in different lengths to provide contact regions. The gate electrodes have a conductive region and an insulating region. Contact plugs fills contact holes that pass through the stack of gate electrodes in the contact regions. The contact plugs are connected to the gate electrodes. The contact plugs pass through a conductive region of one gate electrode and are electrically connected to the one gate electrode and pass through the insulating region (Continued)

of other gate electrodes in the contact region. The insulating region is disposed outside of the contact holes in a region in which the gate electrodes intersect the contact plugs.

20 Claims, 32 Drawing Sheets

(51) Int. Cl.
*H01L 23/522* (2006.01)
*H01L 29/417* (2006.01)
*H01L 27/11521* (2017.01)
*H01L 27/11556* (2017.01)
*H01L 27/11568* (2017.01)
*H01L 29/423* (2006.01)
*H01L 23/528* (2006.01)
*H01L 21/768* (2006.01)
*H01L 29/788* (2006.01)
*H01L 29/66* (2006.01)
*H01L 21/3115* (2006.01)
*H01L 21/311* (2006.01)
*H01L 21/02* (2006.01)
*H01L 21/28* (2006.01)

(56) References Cited

U.S. PATENT DOCUMENTS

| | | | |
|---|---|---|---|
| 8,664,108 B2 | 3/2014 | Mizukami et al. | |
| 8,765,598 B2 | 7/2014 | Smith et al. | |
| 9,252,156 B2 | 2/2016 | Shih et al. | |
| 9,356,038 B2 | 5/2016 | Lee et al. | |
| 9,520,402 B1 | 12/2016 | Haller et al. | |
| 9,536,823 B2 | 1/2017 | Smith et al. | |
| 2003/0029839 A1 | 2/2003 | Chou | |
| 2012/0112260 A1* | 5/2012 | Kim | H01L 29/7926 257/315 |
| 2012/0208347 A1* | 8/2012 | Hwang | H01L 27/11582 438/430 |
| 2014/0166963 A1* | 6/2014 | Lee | H01L 27/11556 257/4 |
| 2015/0255484 A1 | 9/2015 | Imamura et al. | |
| 2016/0027730 A1 | 1/2016 | Lee | |
| 2017/0117290 A1* | 4/2017 | Lee | G11C 16/0483 |

* cited by examiner

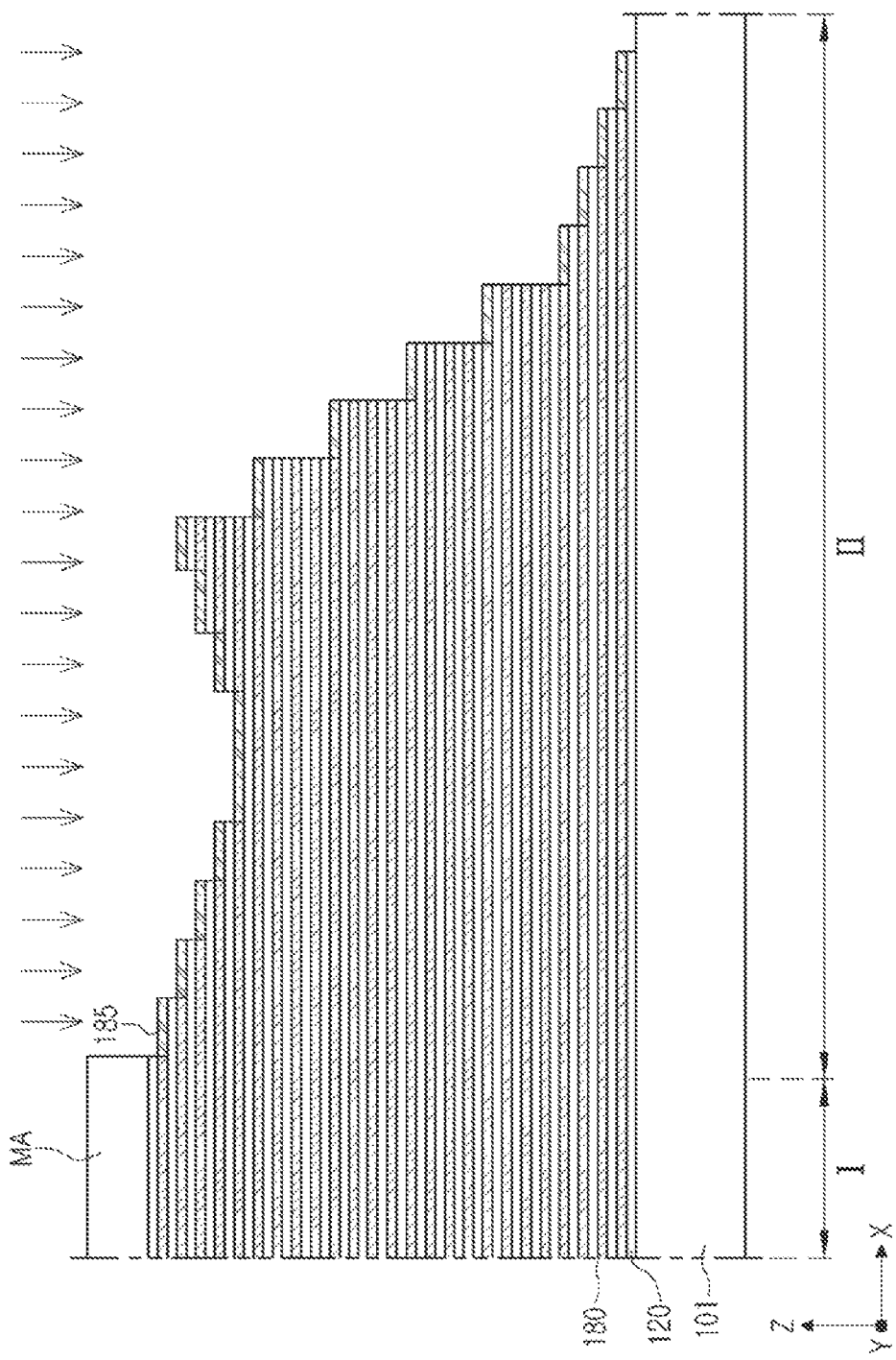

SEMICONDUCTOR DEVICES AND MANUFACTURING METHODS OF THE SAME

CROSS-REFERENCE TO RELATED APPLICATION

This application claims benefit of, and priority to, Korean Patent Application No. 10-2018-0066815 filed on Jun. 11, 2018 in the Korean intellectual Property Office, the disclosure of which is incorporated by reference herein in its entirety.

TECHNICAL FIELD

The present disclosure relates to semiconductors and, more specifically, to a semiconductor device and a method for manufacturing the same.

DISCUSSION OF THE RELATED ART

Semiconductor devices are becoming more powerful even as they are getting smaller in size. This is accomplished by designing semiconductor devices with a higher degree of integration of its constituent elements. One way in which the degree of integration is increased is by utilizing a vertical transistor structure in place of a conventional planar transistor structure. In a semiconductor device having a vertical transistor structure, elements occupy multiple levels, thereby increasing the number of elements that may be disposed on a single die, without increasing the footprint of that die.

SUMMARY

A semiconductor device includes a plurality of gate electrodes that are stacked and spaced apart from each other in a direction perpendicular to an upper surface of a substrate. The plurality of gate electrodes extend in different lengths from each other in one direction to provide a plurality of contact regions. Each of the plurality of gate electrodes has a conductive region and an insulating region. A plurality of contact plugs fills contact holes that pass through an entirety of the plurality of gate electrodes stacked on the substrate in the contact regions. The plurality of contact plugs is connected to the plurality of gate electrodes. Each of the plurality of contact plugs passes through a conductive region of one gate electrode among the plurality of gate electrodes and is electrically connected to the one gate electrode and passes through a plurality of insulating regions of other gate electrodes of the plurality of gate electrodes, in the contact region. The insulating region of each of the plurality of gate electrodes is disposed outside of the contact holes in a region in which the plurality of gate electrodes intersect the plurality of contact plugs.

A semiconductor device includes a plurality of gate conductive regions that are spaced apart from each other and stacked in a direction perpendicular to an upper surface of a substrate. Each of the plurality of gate conductive regions includes a first conductive region and a plurality of second conductive regions. Each of a plurality of gate insulating regions is at least partially surrounded by a corresponding gate conductive region of the plurality of gate conductive regions. The plurality of gate insulating regions occupy substantially a same level as a corresponding gate conductive region of the plurality of gate conductive regions. A contact plug fills a contact hole that passes through one of the plurality of gate conductive regions and a corresponding one of the plurality of gate insulating regions, and is electrically connected to the one of the plurality of gate conductive regions. The contact plug passes through the first gate conductive region and the gate insulating regions. A distance from an adjacent edge of the first gate conductive region to the contact hole is different from an adjacent edge of a distance from each of the plurality of second gate conductive regions to the contact hole.

A semiconductor device includes a plurality of gate electrodes that are spaced apart from each other and stacked in a direction perpendicular to an upper surface of a substrate, and extended by different lengths in one direction to provide a plurality of contact regions. A plurality of contact plugs fill contact holes that pass through the plurality of gate electrodes in the plurality of contact regions and extended toward the substrate. A plurality of insulating regions is disposed outside of the contact holes in regions in which the plurality of contact plugs and the plurality of gate electrodes intersect.

A method for manufacturing a semiconductor device includes forming a stacked structure by alternately stacking a plurality of sacrificial layers and a plurality of interlayer insulating layers on a substrate. A plurality of contact regions extended by different lengths is formed by removing a portion of each of the plurality of sacrificial layers and each of the plurality of interlayer insulating layers. A plurality of impurity regions is formed by injecting impurities into the plurality of sacrificial layers in an uppermost portion thereof that is exposed upwardly in contact regions. A plurality of first openings is formed passing through the stacked structure in the contact regions. A portion of each of the plurality of sacrificial layers is removed and exposed through the plurality of first openings. A plurality of insulating regions are formed by depositing an insulating material in a region from which the plurality of sacrificial layers are removed. A plurality of sacrificial plugs is formed by filling the plurality of first openings. A plurality of second openings is formed passing through the stacked structure. The plurality of sacrificial layers are removed and the plurality of impurity regions are removed through the plurality of second openings. A plurality of gate electrodes is formed by filling a conductive material in a region from which the plurality of sacrificial layers and the plurality of impurity regions are removed. The plurality of sacrificial plugs is removed. A plurality of contact plugs is formed by filling a conductive material in a region from which the plurality of sacrificial plugs are removed.

BRIEF DESCRIPTION OF DRAWINGS

The above and other aspects and features of the present disclosure will be more clearly understood from the following detailed description, taken in conjunction with the accompanying drawings, in which:

FIGS. 13A to 13K are schematic cross-sectional views illustrating a method for manufacturing a semiconductor device according to example embodiments of the present inventive concept;

DETAILED DESCRIPTION

Hereinafter, the example embodiments of the present disclosure will be described in detail with reference to the attached drawings.

Figure 1:
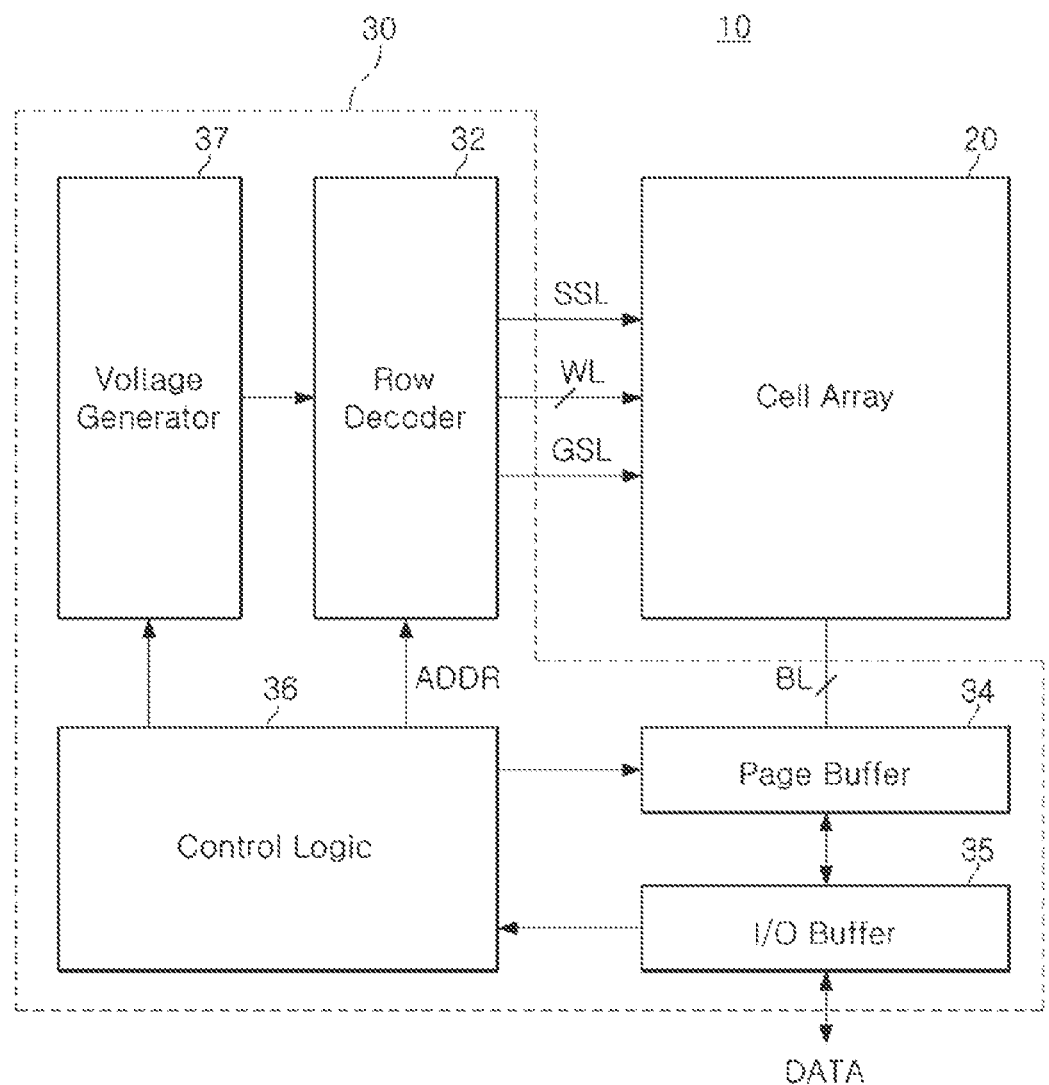
FIG. 1 is a schematic block diagram illustrating a semiconductor device according to example embodiments of the present inventive concept.

FIG. 1 is a schematic block diagram illustrating a semiconductor device according to example embodiments of the present inventive concept.

Referring to FIG. 1, a semiconductor device 10 may include a memory cell array 20 and a peripheral circuit 30. The peripheral circuit 30 may include a row decoder 32, a page buffer 34, an input/output (I/O) buffer 35, a control logic 36, and a voltage generator 37.

The memory cell array 20 may include a plurality of memory blocks, and each of the memory blocks may include a plurality of memory cells. The plurality of memory cells may be connected to the row decoder 32 through a string select line SSL, word lines WL, and a ground select line GSL, and may be connected to the page buffer 34 through bit lines BL. In example embodiments of the present inventive concept, a plurality of memory cells arranged in the same row may be connected to a single word line WL, and a plurality of memory cells arranged in the same column may be connected to a single bit line BL.

The row decoder 32 may decode an address ADDR, having been input, and may thus generate and transmit driving signals of the word line WL. The row decoder 32 may provide a word line voltage, generated by the voltage generator 37, to a selected word line WL and unselected word lines WL, in response to, and under the control of, the control logic 36.

The page buffer 34 is connected to the memory cell array 20 through the bit lines BL, and may thus read information that is stored in the memory cells. The page buffer 34 may temporarily store data that is to be stored in the memory cells, or may read data, stored in the memory cell, according to a mode of operation. The page buffer 34 may include a column decoder and a sense amplifier. The column decoder may selectively activate bit lines BL of the memory cell array 20, while the sense amplifier may sense a voltage of a bit line BL, selected by the column decoder, and may thus read data, stored in a memory cell, having been selected.

The I/O buffer 35 may receive data DATA and transfer the data to the page buffer 34 during a programming operations, and may output the data DATA, transferred by the page buffer 34, to an external device, during a reading operation. The I/O buffer 35 may transmit address or command, having been input, to the control logic 36.

The control logic 36 may control operations of the row decoder 32 and the page buffer 34. The control logic 36 may receive a control signal and an external voltage, transmitted from an external source, and may be operated according to a control signal, having been received. The control logic 36 may control reading, writing, and/or erasing operations in response to, and under the direction of, the control signals.

The voltage generator 37 may generate voltages, for example, a programming voltage, a reading voltage, an erasing voltage, and the like, required for an internal operations using an external voltage (e.g. a voltage provided from an external source). The voltage, generated by the voltage generator 37, may be transferred to the memory cell array 20 through the row decoder 32.

Figure 2:
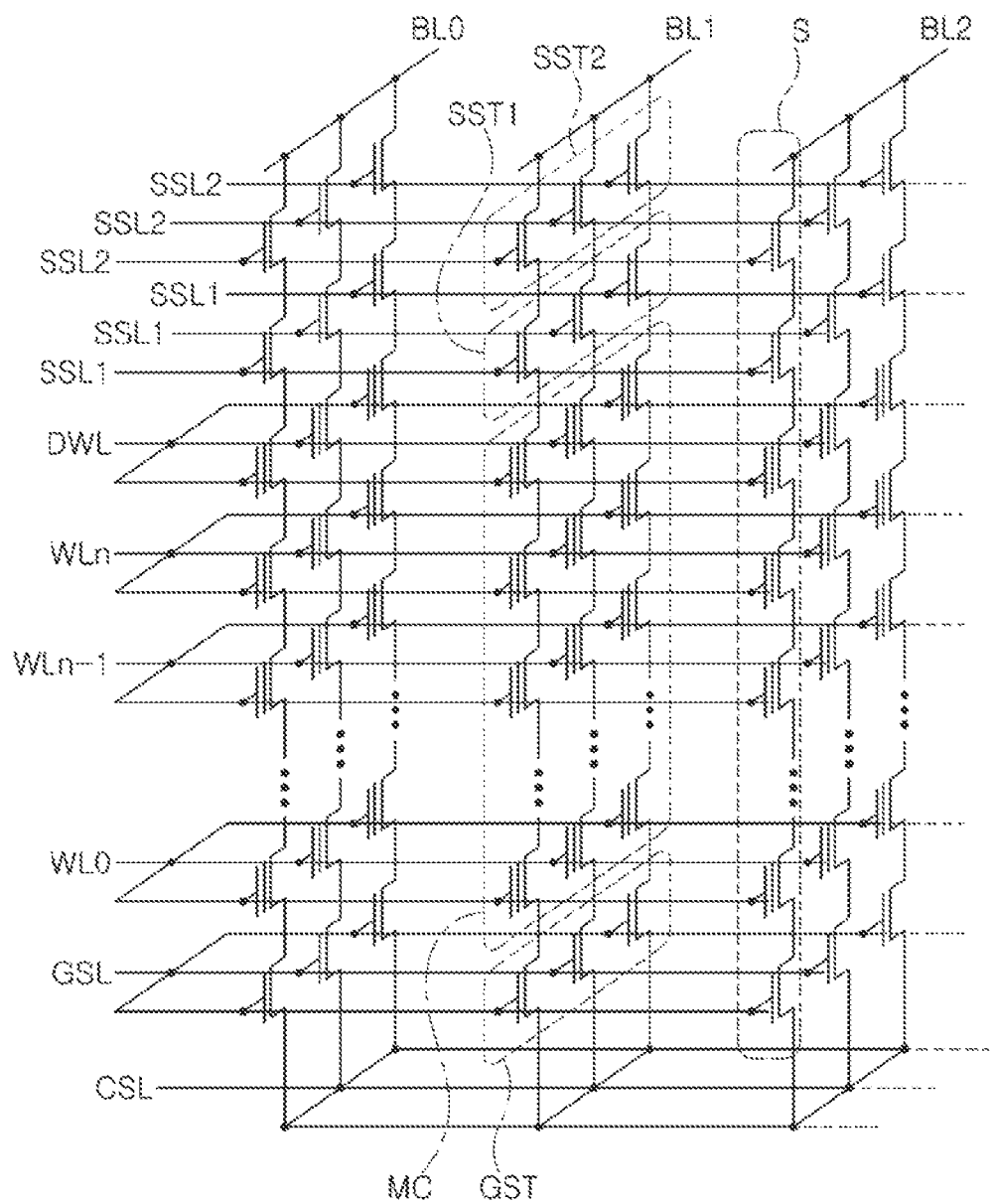
FIG. 2 is an equivalent circuit diagram of a cell array of a semiconductor device according to example embodiments of the present inventive concept.

FIG. 2 is an equivalent circuit diagram of a cell array of a semiconductor device according to example embodiments of the present inventive concept.

Referring to FIG. 2, the memory cell array 20 may include a plurality of memory cell strings S, each of which includes memory cells MC connected to each other in series, and a ground select transistor GST and string select transistors SST1 and SST2 connected to both ends of the memory cells MC in series. The plurality of memory cell strings S may be connected to respective bit lines BL0 to BL2 in parallel. The plurality of memory cell strings S may be connected to a common source line CSL in common. For example, the plurality of memory cell strings S may be disposed between the plurality of bit lines BL0 to BL2 and a single common source line CSL. In an example embodiment of the present disclosure, a plurality of common source lines CSL may be arranged two-dimensionally (e.g. substantially within a common plane).

The memory cells MC, connected to each other in series, may be controlled by word lines WL0 to WLn for selecting the memory cells MC. Each of the memory cells MC may include a data storage element. Gate electrodes of the memory cells MC, arranged at substantially the same distance from the common source line CSL, may be commonly connected to one of the word lines WL0 to WLn and may be in an equipotential state. Alternatively, even when the gate electrodes of the memory cells MC are arranged at substantially the same distance from the common source line CSL, gate electrodes, disposed in different rows or columns, may be controlled independently.

The ground select transistor GST may be controlled by a ground select line GSL, and may be connected to a common source line CSL. The string select transistors SST1 and SST2 may be controlled by the string select lines SSL1 and SSL2, and may be connected to the bit lines BL0 to BL2. FIG. 2 illustrates a structure in which a single ground select transistor GST and two string select transistors SST1 and SST2 are connected to the plurality of memory cells MC connected to each other in series, respectively. In a different manner, a single string select transistor, each of string select transistors SST1 and SST2, or a plurality of ground select transistors GST may also be connected to the memory cells MC. One or more dummy lines DWL or buffer lines may be further disposed between an uppermost word line among the word lines WL0 to WLn, and the string select lines SSL1 and SSL2. In an example embodiment of the present disclosure, one or more dummy lines DWL may also be disposed between a lowermost word line WL0 and the ground select line GSL. As used herein, the term "dummy" is used to denote that a component may have the same or a similar structure and shape to that of other components while not having the same practical function as the other components within a device.

When a signal is applied to the string select transistors SST1 and SST2 through the string select lines SSL1 and SSL2, a signal, applied through the bit lines BL0 to BL2, may be transmitted to the memory cells MC, connected to each other in series, and a data reading operation and a data writing operation may be performed. Moreover, a predetermined erasing voltage may be applied through a substrate, so an erasing operation for erasing data, written on the memory cells MC, may be performed. In an example embodiment of the present disclosure, the memory cell array 20 may include at least one dummy memory cell string, electrically isolated from the bit lines BL0 to BL2.

Figure 3:
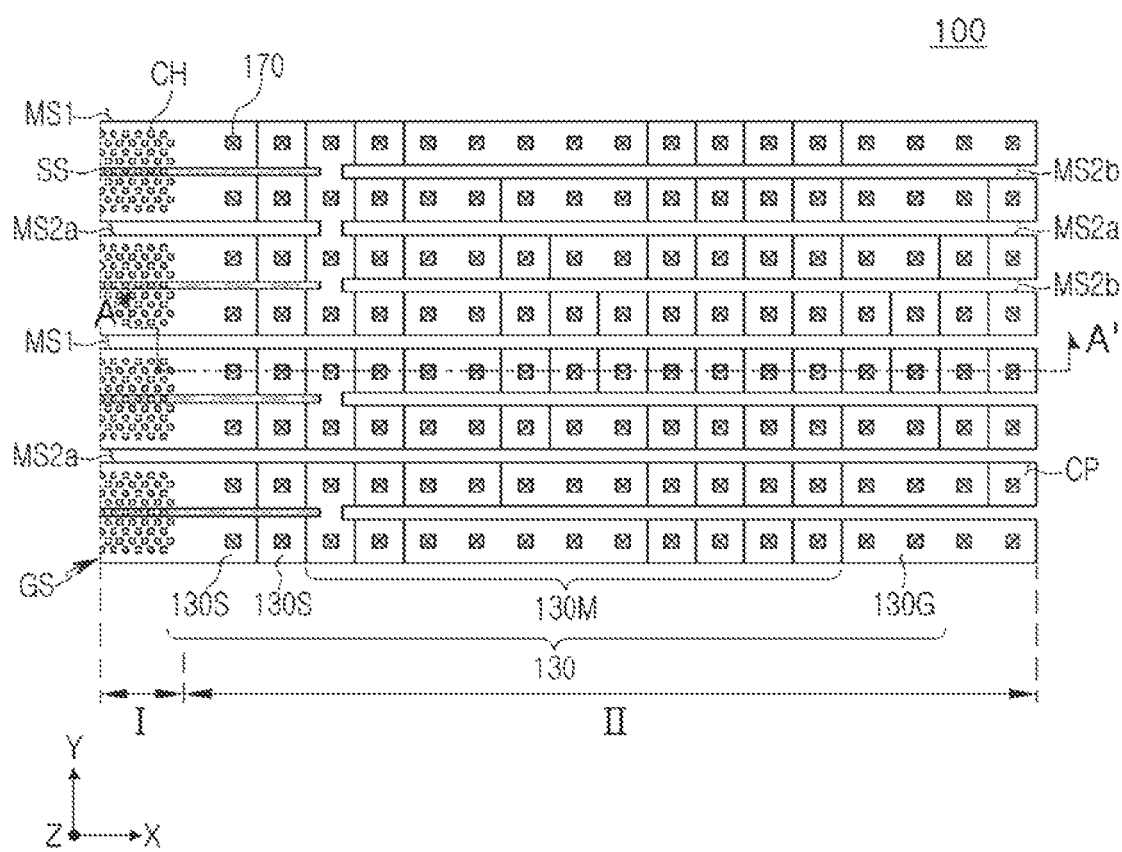
FIG. 3 is a schematic plan view illustrating a semiconductor device according to example embodiments of the present inventive concept.
Figure 4:
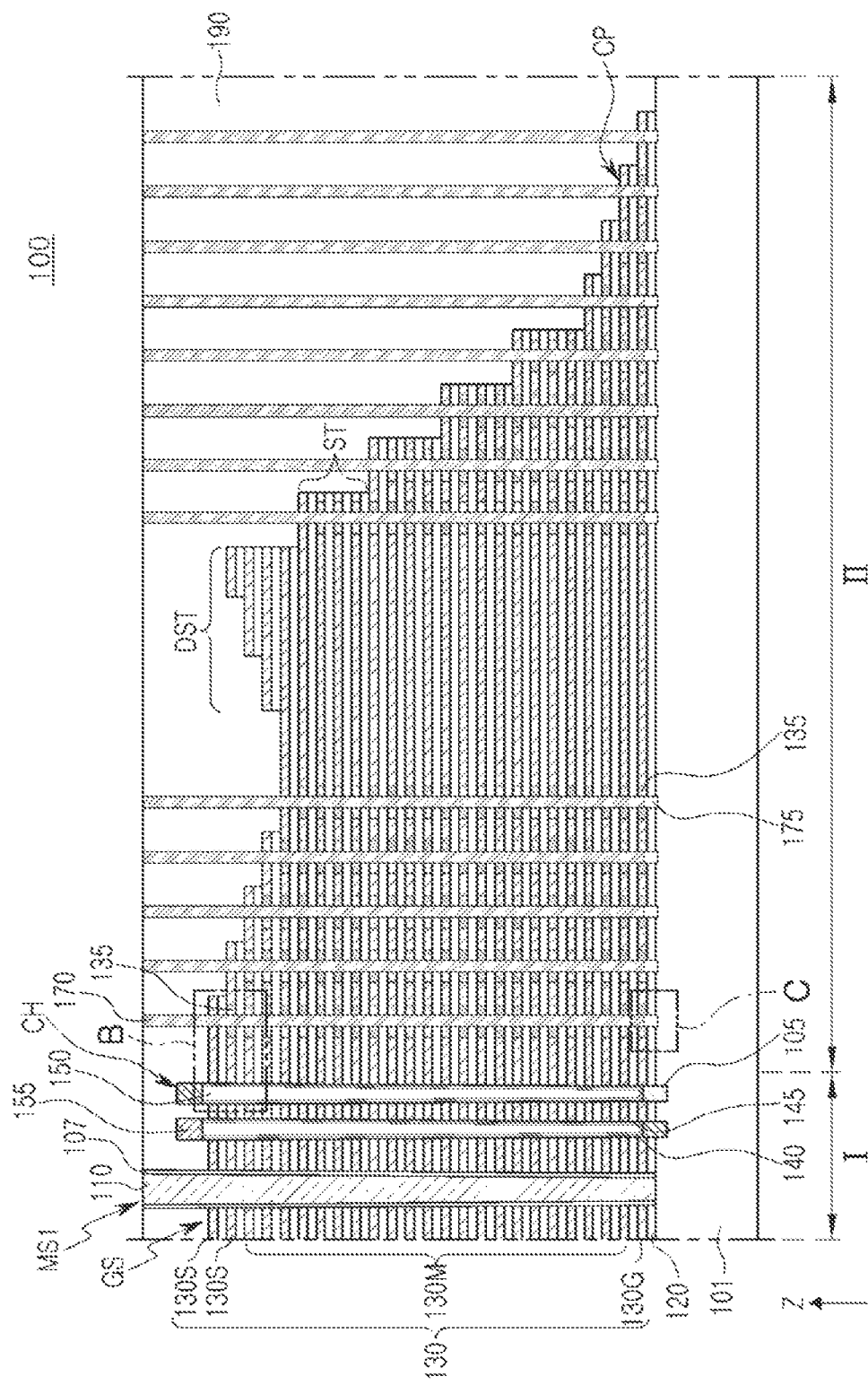
FIG. 4 is a schematic cross-sectional view illustrating a semiconductor device according to example embodiments of the present inventive concept.

FIG. 3 is a schematic plan view illustrating a semiconductor device according to example embodiments of the present inventive concept. In FIG. 3, main components of the semiconductor device 100 are illustrated alone for the sake of understanding and it is to be understood that additional components may be present. FIG. 4 is a schematic cross-sectional view illustrating a semiconductor device according to example embodiments of the present inventive concept. FIG. 4 illustrates a cross section cut along line A-A' of FIG. 3.

Referring to FIGS. 3 and 4, the semiconductor device 100 may include a substrate 101 having a first region I and a second region II. Gate electrodes 130 are stacked on the substrate 101. A first separation region MS1 and second separation regions MS2a and MS2b pass through a stacked structure GS of the gate electrodes 130 and are extended. Upper separation regions SS pass through a portion of the stacked structure GS. Channels CH pass through the stacked structure GS. Contact plugs 170 are connected to the gate electrodes 130. The semiconductor device 100 may further include interlayer insulating layers 120 alternately stacked on the substrate 101 with the gate electrodes 130, a gate dielectric layer 145, a channel region 140 in channels CH, a channel pad 155, a channel insulating layer 150, and a cell region insulating layer 190.

The first region I of the substrate 101 may be a region in which the gate electrodes 130 are vertically stacked and channels CH are disposed, and may be a region corresponding to the memory cell array 20 of FIG. 1, while the second region II may be a region in which the gate electrodes 130 are extended by different lengths, and may correspond to a region for electrically connecting the memory cell array 20 to the peripheral, circuit 30 of FIG. 1. The second region II may be disposed in at least one end of the first region I in at least one direction, for example, an X-direction.

The substrate 101 may have the upper surface extended in the X-direction and a Y-direction. The substrate 101 may include a semiconductor material, such as a Group IV semiconductor, a Group III-V compound semiconductor, and/or a Group II-VI compound semiconductor. For example, the Group IV semiconductor may include silicon, germanium, and/or silicon-germanium. The substrate 101 may be a bulk wafer or an epitaxial layer.

The gate electrodes 130 may be spaced apart from each other and vertically stacked on the substrate 101, thereby forming the stacked structure GS. The gate electrodes 130 may include a lower gate electrode 130G, forming a gate of the ground select transistor GST of FIG. 2, memory gate electrodes 130M, forming a plurality of memory cells MC, and upper gate electrodes 130S, forming a gate of the string select transistors SST1 and SST2. The number of the memory gate electrodes 130M, forming the memory cells MC, may be determined depending on capacity of the semiconductor device 100. According to an example embodiment of the present disclosure, the upper and lower gate electrodes 130S and 130G of the string select transistors SST1 and SST2 and the ground select transistor GST may be provided singularly or in plural, and may have the same or different structure from that of the gate electrodes 130 of the memory cells MC. Some gate electrodes 130, for example, memory gate electrodes 130M, adjacent to the upper or lower gate electrode 130S and 130G, may be dummy gate electrodes.

The gate electrodes 130 may be spaced apart from each other and vertically stacked on the first region I, and may be extended by different lengths from the first region I to the second region II and stepped in a staircase shape. The gate electrodes 130 are stepped in the X-direction as illustrated in FIG. 4, and may be stepped in the Y-direction. Due to, the stepped portion, a lower gate electrode 130 is extended longer than an upper gate electrode 130, so the gate electrodes 130 may provide contact regions CP exposed upwardly. The gate electrodes 130 may be connected to, the contact plugs 170 in the contact regions CP. Among the gate electrodes 130, except for upper and lower gate electrodes 130S and 130G, at least a portion of the memory gate electrodes 130M, that is, a certain number of memory gate electrodes, for example, four memory gate electrodes, may form a single stack ST. Thus, a stepped portion may be provided between stacks ST. Four memory gate electrodes 130M, forming a single stack ST, may be stepped in the X-direction. Moreover, a dummy stack DST, not connected to the contact plugs 170, may be disposed on an uppermost stack ST.

As illustrated in FIG. 3, the gate electrodes 130 may be separated from each other in the Y-direction by the first separation region MS1 extended in the X-direction. Gate electrodes 130, between a pair of first separation regions MS1, may form a single memory block, but a range of a memory block is not limited thereto. A portion of the gate electrodes 130, for example, memory gate electrodes 130M, may form a single layer in a single memory block.

The gate electrodes 130 may include insulating regions 135 at least partially surrounding a periphery of the contact plugs 170 in the second region II. The insulating regions 135 may be included in the gate electrodes 130 not exposed through an upper portion in the contact regions CP, for example, the gate electrodes 130 not disposed in an uppermost portion. The insulating regions 135 may be disposed outside of contact holes passing through the gate electrodes 130. The contact holes may correspond to third openings OP3, to be described later with reference to FIG. 13K. The insulating regions 135 may be disposed outside of the contact holes or externally in a region in which the gate electrodes 130 and the contact plugs 170 intersect. Accordingly, a distance from the gate electrode 130 in the uppermost portion to the contact hole may be different from a distance from lower gate electrodes 130 to the contact hole along, the X-direction, and may be zero.

The insulating regions 135 may be arranged in a row in a direction perpendicular to the substrate 101 along respective contact plugs 170. For example, the insulating regions 135 of different gate electrodes 130 may be disposed in positions, the same as or corresponding to each other in a Z-direction. The insulating regions 135 may include an insulating material, for example, silicon oxide. In a conductive region, a region except for the insulating regions 135, the gate electrodes 130 may include a metallic material, for example, tungsten (W). According to an example embodiment of the present disclosure, the gate electrodes 130 may include polycrystalline silicon or a metal silicide material. In example embodiments of the present inventive concept, the gate electrodes 130 may further include a diffusion barrier, and the diffusion barrier may contain, for example, tungsten nitride (WN), tantalum nitride (TaN), titanium nitride (TiN), or combinations thereof.

The interlayer insulating layers 120 may be disposed between the gate electrodes 130. The interlayer insulating layers 120 may also be spaced apart from each other in a direction perpendicular to the upper surface of the substrate 101 and to be extended in the X-direction, in a manner similar to the gate electrodes 130. The interlayer insulating layers 120 may include an insulating material, such as silicon oxide or silicon nitride.

The first separation regions MS1 and the second separation regions MS2a and MS2b may pass through the gate electrodes 130 in the first region I and the second region II and may be extended in the X-direction. The first separation regions MS1 and the second separation regions MS2a and MS2b may be disposed in parallel to each other. The first separation regions MS1 and the second separation region MS2a and MS2b may be repeatedly disposed in a predetermined pattern in the y-direction. The first separation regions MS1 and the second separation region MS2a and MS2b may pass through the entirety of the gate electrodes 130, stacked on the substrate 101, and may be connected to the substrate 101.

The second separation regions MS2a and MS2b may include second central separation regions MS2a disposed in the middle of a pair of the first separation regions MS1 and second auxiliary separation regions MS2b disposed between the first separation region MS1 and the second central separation region MS2a. The second, central separation regions MS2a may be disposed over the entirety of the first region I and the second region II, while the second auxiliary separation regions MS2b may be only disposed in the second region II. The second central separation regions MS2a may be extended as a single region in the first region I, and may be spaced apart from each other in the X-direction to allow the gate electrodes 130 to be connected to each other and may be a plurality of regions disposed on a straight line in the second region II. According to example embodiments of the present inventive concept, all of the second separation regions MS2a and MS2b may be a plurality of second separation regions disposed on a straight line in the second region II. However, the order of arrangement, the number of element, and the like, of the first separation regions MS1 and the second separation regions MS2a and MS2b, are not limited to those illustrated in FIG. 3.

The common source line CSL, described with reference to FIG. 2, may be disposed in the first separation regions MS1, and the dummy common source line may be disposed in the second separation regions MS2a and MS2b. As illustrated in FIG. 4, the first separation regions MS1 and the second separation regions MS2a and MS2b may include a source insulating layer 107 and a source conductive layer 110 insulated from the gate electrodes 130 by the source insulating layer 107. The source conductive layer 110 of the first separation regions MS1 may correspond to the common source line CSL, and the source conductive layer 110 of the second separation regions MS2a and MS2b may correspond to the dummy common source line. Thus, the source conductive layer 110, forming the second separation regions MS2a and MS2b, may be in a floating state, in which it is not connected to elements driving the semiconductor device 100 or an electrical signal is not applied. An upper surface of the source conductive layer 110 may be located on a level the same as a level of an upper surface of the contact plugs 170, but the present invention, is not limited thereto.

Upper separation regions SS may be extended in the X-direction between the first separation regions MS1 and the second central separation region MS2a. The upper separation regions SS may be disposed in parallel with the second auxiliary separation region MS2b. The upper separation regions SS may be disposed in a portion of the second region II, and the first region I, to pass through a portion of gate electrodes 130, including the upper gate electrodes 130S, among the gate electrodes 130. The upper gate electrodes 130S, separated by the upper separation regions SS, may form different string select lines SSL (see FIG. 2). The upper separation regions SS may include an insulating layer. The upper separation regions SS, may separate, for example, a total of three gate electrodes 130, including the upper gate electrodes 130S, from each other in the Y-direction. However, the number of the gate electrodes 130, separated by the upper separation regions SS, may be variously changed. In example embodiments of the present inventive concept, the semiconductor device 100 may further include insulating layers separating lower gate electrodes 130G among the gate electrodes 130. For example, the insulating layer may separate lower gate electrodes 130G in a region between the second central separation regions MS2a spaced apart from each other on a straight line.

The channels CH may be spaced apart from each other in rows and columns on the first region I. The channels CH may form a grid pattern or disposed in a zigzag in a direction. The channel CH may have a columnar shape, and may have an inclined side surface narrowing towards the substrate 101 according to aspect ratios. In example embodiments of the present inventive concept, dummy channels may be further disposed in an end portion of the first region I, adjacent to the second region II, and the second region II.

A channel region 140 may be disposed in the channels CH. In the channel CH, the channel region 140 may have an annular form at least partially surrounding the channel insulating layer 150, formed therein. However, the channel region may have a columnar shape without the channel insulating layer 150, such as a cylinder or a prism, according to an example embodiment of the present disclosure. The channel region 140 may be connected to an epitaxial layer 105 in a lower portion of the channel region. The channel region 140 may contain a semiconductor material such as polycrystalline silicon or single crystalline silicon, and the semiconductor material may, be a material undoped with impurities, or a material containing p-type or n-type impurities. Channels CH, disposed on a straight line in the Y-direction between the first or second separation regions MS1, MS2a, and MS2b and the upper separation, region SS, may be connected to different bit lines BL0 to BL2 (see FIG.

2), according to an arrangement of an upper wiring structure connected to the channel pad 155.

Channel pads 155 may be disposed in an upper portion of the channel region 140 in the channels CH. The channel pads 155 may cover an upper surface of the channel insulating layer 150 and may be electrically connected to the channel region 140. The channel pads 155 may include, for example, doped polycrystalline silicon.

The gate dielectric layer 145 may be disposed between the gate electrodes 130 and the channel region 140. The gate dielectric layer 145 may include a tunneling layer, an electric charge storage layer, and a blocking layer sequentially stacked from the channel region 140. The tunneling layer may allow a charge to tunnel to the charge storage layer, and may include, for example, silicon oxide ($SiO_2$), silicon nitride ($Si_3N_4$), silicon oxynitride (SiON), or combinations thereof. The charge storage layer may be a charge trap layer or a floating gate conductive layer. The blocking layer may include silicon oxide ($SiO_2$), silicon nitride ($Si_3N_4$), silicon oxynitride (SiON), a high-k dielectric material or combinations thereof. In example embodiments of the present inventive concept, at least a portion of the gate dielectric layer 145 may be extended in a horizontal direction along the gate electrodes 130.

The epitaxial layer 105 may be disposed on the substrate 101 in a lower end of the channels CH, and may be disposed in a side surface of at least one gate electrode 130. The epitaxial layer 105 may be disposed in a recessed region of the substrate 101. A level of an upper surface of the epitaxial layer 105 may be higher than a level of an upper surface of a lowermost gate electrode 130 and may be lower than a level of a lower surface of a gate electrode 130 located thereabove, but is not limited to the arrangement that is illustrated in the drawings. In example embodiments of the present inventive concept, the epitaxial layer 105 may be omitted. In this case, the channel region 140 may be directly connected to the substrate 101 or may be connected to another conductive layer on the substrate 101.

The contact plugs 170 may pass through the cell region insulating layer 190 and may be connected to the gate electrodes 130 in the contact regions CP. The contact plugs 170 may pass through the stacked structure GS of the gate electrodes 130 and may extend adjacent to an upper surface of the substrate 101. Each of the contact plugs 170 may be physically and electrically connected to a gate electrode 130 disposed in an uppermost portion in the contact region CP, and may be electrically isolated from conduction regions of gate electrodes 130, located therebelow, by the insulating regions 135. Thus, each of the contact plugs 170 may pass through the conductive region of a single gate electrode 130 and insulating regions 135 of gate electrodes 130 located therebelow. The contact plugs 170 may have a shape filling contact holes passing through the gate electrodes 130. The contact holes may correspond to third openings OP3, to be described later with reference to FIG. 13K. The contact plugs 170 may be in contact with the conductive region of the gate electrode 130 in an uppermost portion through an external side surface. The arrangement of the contact plugs 170, described above, will be described in more detail below with reference to FIG. 5.

The contact plugs 170 may have a cylindrical shape. In example embodiments of the present inventive concept, the contact plugs 170 may have an inclined side surface narrowing towards the substrate 101 according to aspect ratios. The contact plugs 170 may have a width substantially the same as that of the contact holes, and may pass through the gate electrodes 130, the interlayer insulating layers 120, and the cell region insulating layer 190 with substantially the same width. For example, the contact plugs 170 may pass through one of the gate electrodes 130 and an interlayer insulating layer 120 in contact with the gate electrode 130 with substantially the same width. The contact plugs 170 may pass through a gate electrode 130 in an uppermost portion and a cell region insulating layer 190 on the gate electrode 130 with substantially the same width. Accordingly, widths of the contact plugs 170 in a region, in contact with conductive regions of the gate electrodes 130 disposed in an uppermost portion, may be equal to widths of the contact holes on or above the gate electrodes disposed in the uppermost portion. Moreover, a width of contact plugs 170, passing through the gate electrodes 130 in an uppermost portion, may be substantially the same as a width of the contact hole in an upper portion of the gate electrode 130 in an uppermost portion. Moreover, according to example embodiments of the present inventive concept, the contact plugs 170 may pass through gate electrodes 130, interlayer insulating layers 120, and the cell region insulating layer 190 with continuously changing widths. This continuous change in width may be used instead of having a sudden discontinuous change in width, and may be a gradual change, in which a recognizable stepped portion, or the like, is not formed. According to example embodiments of the present inventive concept, portions of the contact plugs 170, connected to a single gate electrode 130, may be a dummy contact plug.

The contact plugs 170 may pass through all gate electrodes 130, stacked on the substrate 101, in a region, in which the contact plugs 170 are disposed. The contact plugs 170 may pass through at least a portion of a gate electrode 130 in a lowermost portion at a lower end, and may be spaced apart from the substrate 101 by the insulating region 135 and the substrate insulating layer 175. As described above, the contact plugs 170 may be connected to the gate electrode 130, disposed on different levels, respectively, and may be extended on the substrate 101 at the same time. Thus, as compared with a case in which the contact plugs 170 are formed to have different levels, a process may be simplified. Moreover, the occurrence of defects, in which it is not in contact with a corresponding gate electrode 130 or it is simultaneously in contact with a gate electrode 130 located in a lower portion, may be prevented.

The contact plugs 170 may include a conductive material. The contact plugs 170 may include, for example, tungsten (W), aluminum (Al), copper (Cu), a tungsten nitride (WN), a tantalum nitride (TaN), a titanium nitride (TiN), or combinations thereof. For example, the contact plugs 170 may be formed having a double layer.

Figure 5:
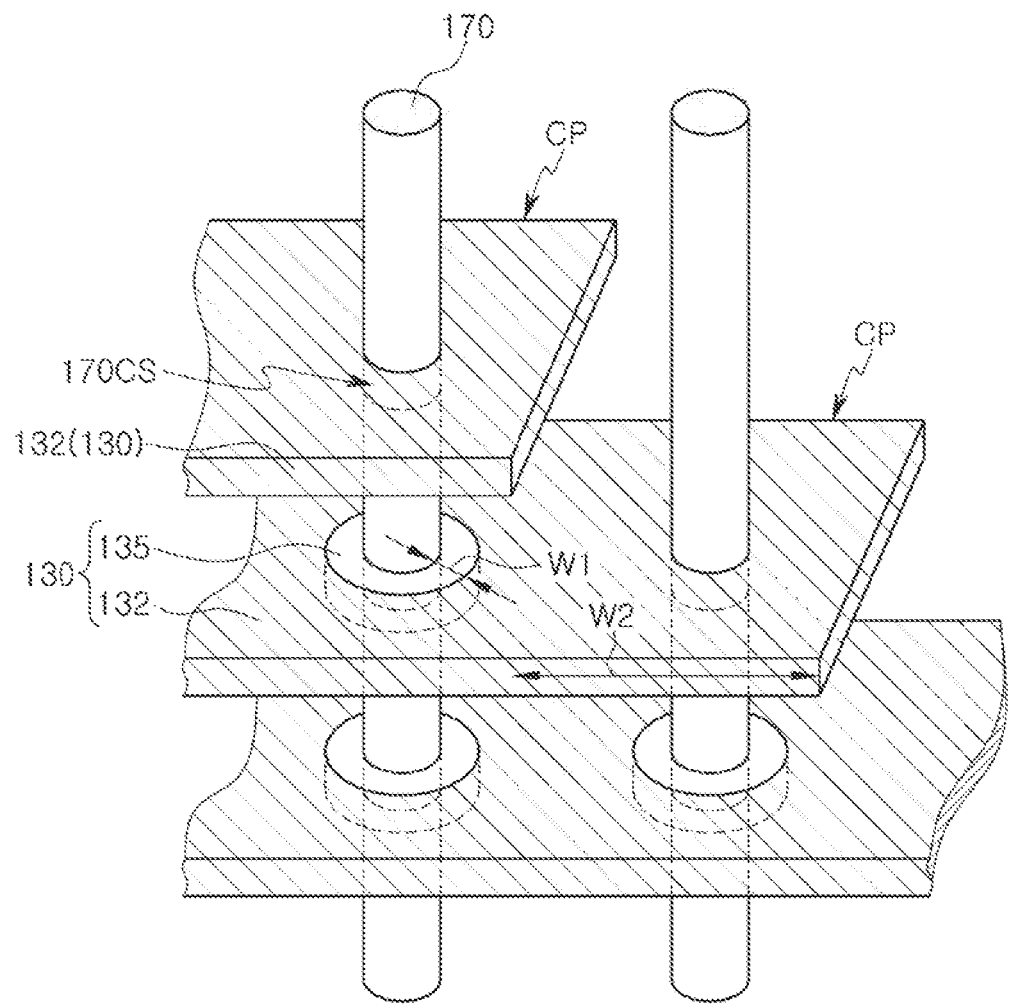
FIG. 5 is a partially cutaway perspective view illustrating a portion of a semiconductor device according to example embodiments of the present inventive concept.

FIG. 5 is a partially cutaway perspective view illustrating a portion of a semiconductor device according to example, embodiments of the present inventive concept.

Referring to FIG. 5, arrangement of gate electrodes 130 and contact plugs 170, in contact regions CP, is illustrated. The contact plugs 170 in the cylindrical form may pass through respective gate electrodes 130 in the contact regions CP. The contact plugs 170 may pass through the gate electrodes 130 in a position spaced apart from an end portion of the gate electrodes 130. For example, the contact plugs may pass through the gate electrodes 130 in a central region of each contact region CP.

The contact plugs 170 may be in contact with a conductive region 132 of the gate electrodes 130, exposed through the contact regions CP, e.g. through an external side surface 170CS. The contact plugs 170 may pass through the insulating regions 135 in gate electrodes 130 in a lower portion, not electrically connected thereto.

The gate electrode 130 may include at least one insulating region 135 at least partially surrounding contact plugs 170 not connected to a corresponding gate electrode 130, and the conductive region 132 at least partially surrounding the insulating region 135. The conductive region 132 may refer to a region of the gate electrode 130, except for the insulating region 135. In the case of a gate electrode 130 in an uppermost portion such as the upper gate electrode 130S of FIG. 4, the insulating region 135 might not be included. The insulating region 135 may at least partially surround the contact plugs 170 and may have an annular shape on a plane. The insulating region 135 might not be exposed through a side surface of the gate electrode 130. For example, the insulating region 135 might not be extended to an end portion of the gate electrode 130, and may be completely surrounded by the conductive region 132.

The insulating region 135 may at least partially surround the contact plugs 170 with a first width W1. The first width W1 may be, for example, 30 nm or more, or for example, 50 nm or more, but is, not limited thereto. Moreover, the first width, may be selected in consideration of a second width W2, a width of the entirety of the contact region CP, a size of the contact plugs 170, and the like. If the first width W1 is smaller than above range, a degree of difficulty of the process may be increased. If the first width W1 is larger than the above range, resistance of the gate electrode 130 may be increased.

FIGS. 6A to 6D are schematic partially enlarged views illustrating a semiconductor device according to example embodiments of the present inventive concept. FIGS. 6A to 6D illustrate a region corresponding to region B of FIG. 4.

Figure 6A:
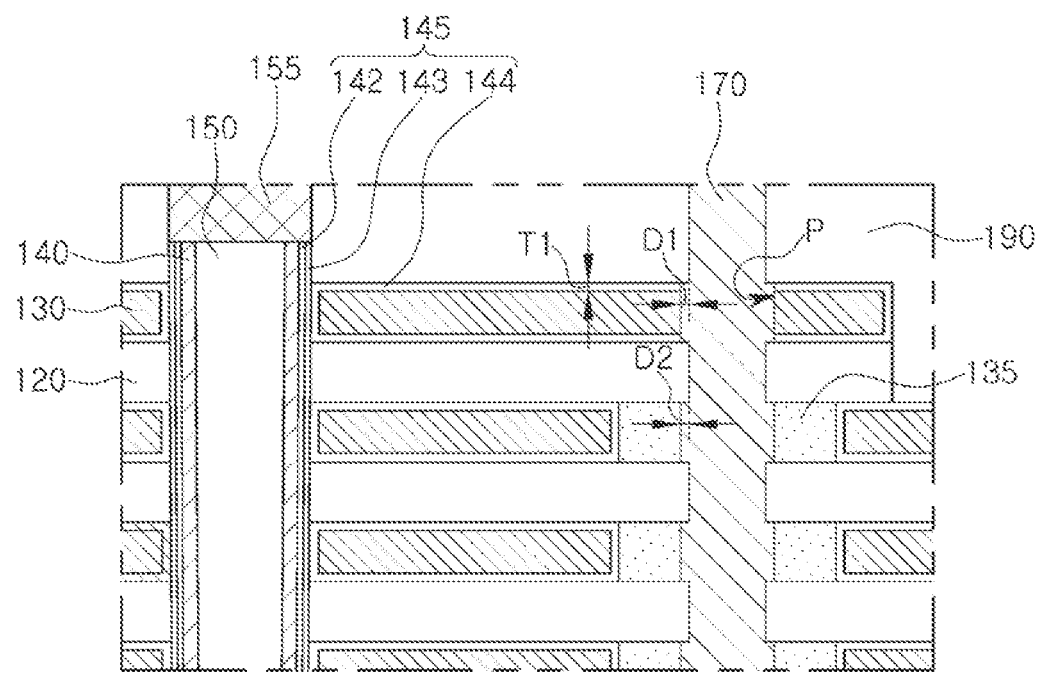
FIGS. 6A to 6D are schematic partially-enlarged views illustrating a semiconductor device according to example embodiments of the present inventive concept.
Figure 6B:
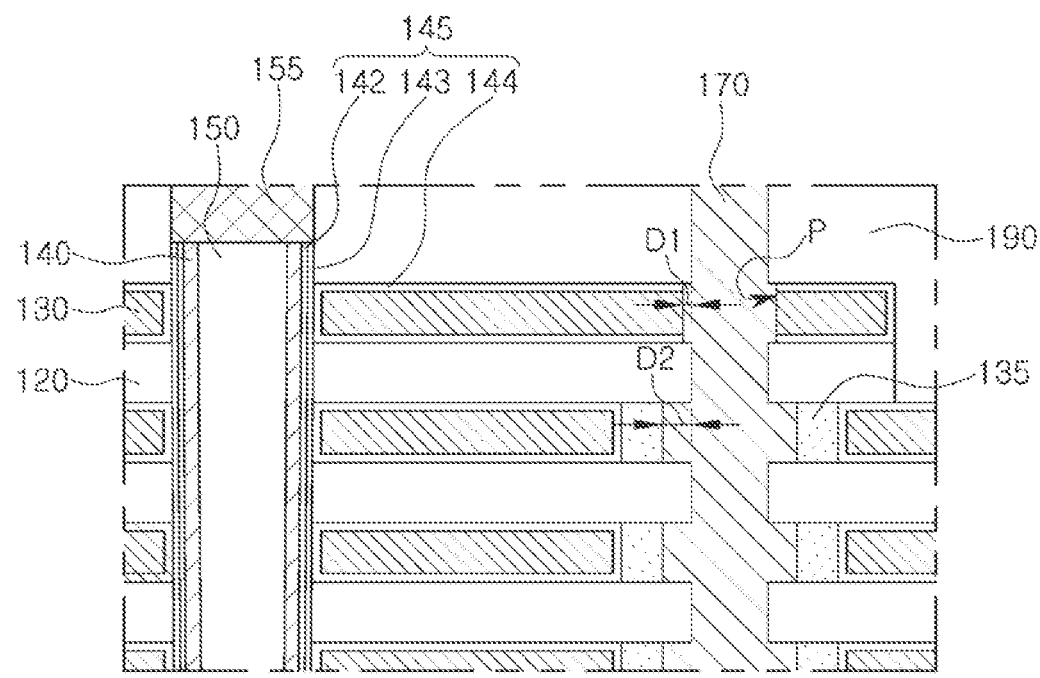

Referring to FIGS. 6A and 6B, a gate dielectric layer 145 may have a structure in which a tunneling layer 142, a charge storage layer 143, and a blocking layer 144 are sequentially stacked from the channel region 140, and the contact plug 170 may have concave-convex portions P in an external side surface.

In the gate dielectric layer 145, the tunneling layer 142 and the charge storage layer 143 are vertically extended along the channel CH, and the blocking layer 144 may be horizontally extended along the gate electrode 130 while at least partially surrounding the gate electrode 130. A relative thickness of the layers, forming the gate dielectric layer 145, is not limited to that illustrated in the drawings, and may be variously changed. In example embodiments of the present inventive concept, the blocking layer 144 may include a plurality of layers, having different dielectric constants, and a portion of the plurality of layers may be vertically extended along the channel CH in a manner similar to the tunneling layer 142 and charge storage layer 143.

The contact plug 170 may have a side surface, in contact with the gate electrode 130 and the blocking layer 144, in a region in contact with a gate electrode 130 in an uppermost portion, and may have a concave-convex portion P protruding outwardly toward the gate electrode 130 and the blocking layer 144. In the contact plug 170, an interface in contact with the gate electrode 130 may be located outwardly, based on an interface in contact with the interlayer insulating layers 120, thereby providing a concave-convex portion P. The contact plug 170 may have a side surface, in contact with the insulating region 135, in a region adjacent to gate electrodes 130 in a lower portion, and may have a concave-convex portion P protruding outwardly toward the insulating region 135. The concave-convex portion P may be a region protruding in the form of a band along a side surface of the contact plug 170.

As illustrated in FIG. 6A, in a region in contact with a gate electrode 130 in an uppermost portion, a first length D1, in which a concave-convex portion P protrudes, may be equal to or greater than a thickness of the blocking layer T1. In a region adjacent to gate electrodes 130 in a lower portion, a second length D2, in which the concave-convex portion P protrudes, may be substantially equal to the first length D1.

Referring to FIG. 6B, a second length D2 in which the concave-convex portion P protrudes in a region adjacent to gate electrodes 130 in a lower portion may be greater than a first length D1 in which the concave-convex portion P protrudes in a region in contact with a gate electrode 130 in an uppermost portion. On the other hand, according to example embodiments of the present inventive concept, the second length D2 may be smaller than the first length D1.

The blocking layer 144, formed between the gate electrodes 130, is removed, and then a contact plug 170 is provided, during a manufacturing process described below with reference to FIG. 13K. Thus, a structure of the concave-convex portion P described above, may be implemented. In this case, a portion of the insulating region 135 is also removed, so a concave-convex portion P may be formed in a region in contact with the insulating region 135, and a structure, illustrated in FIG. 6A or FIG. 6B, may be provided depending on a relative etch degree.

Figure 6C:
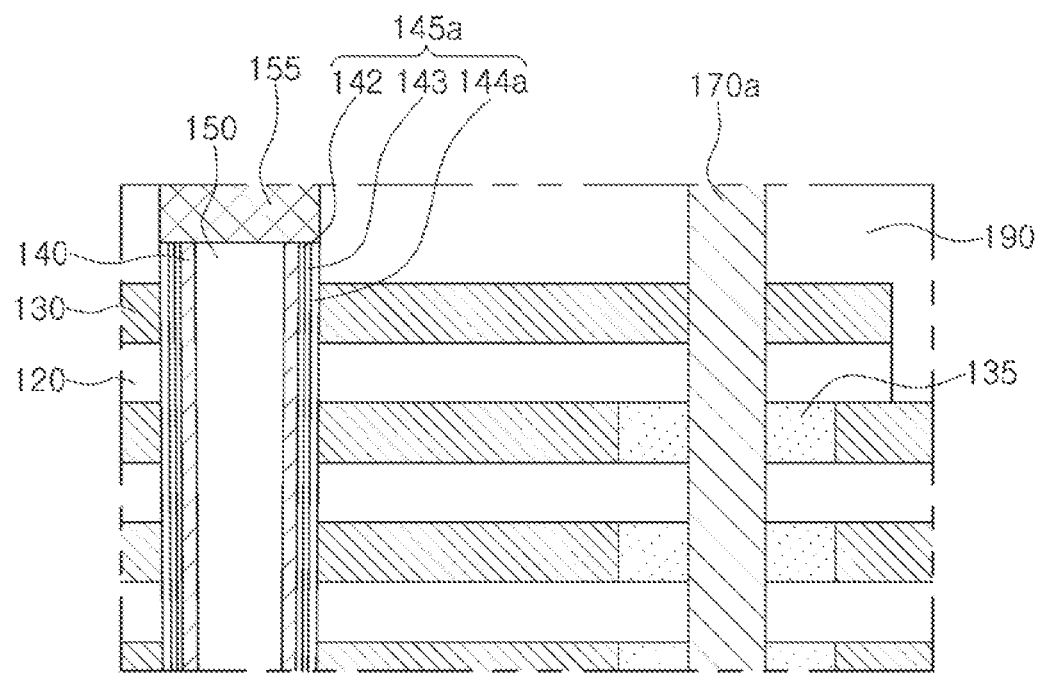
Figure 6D:
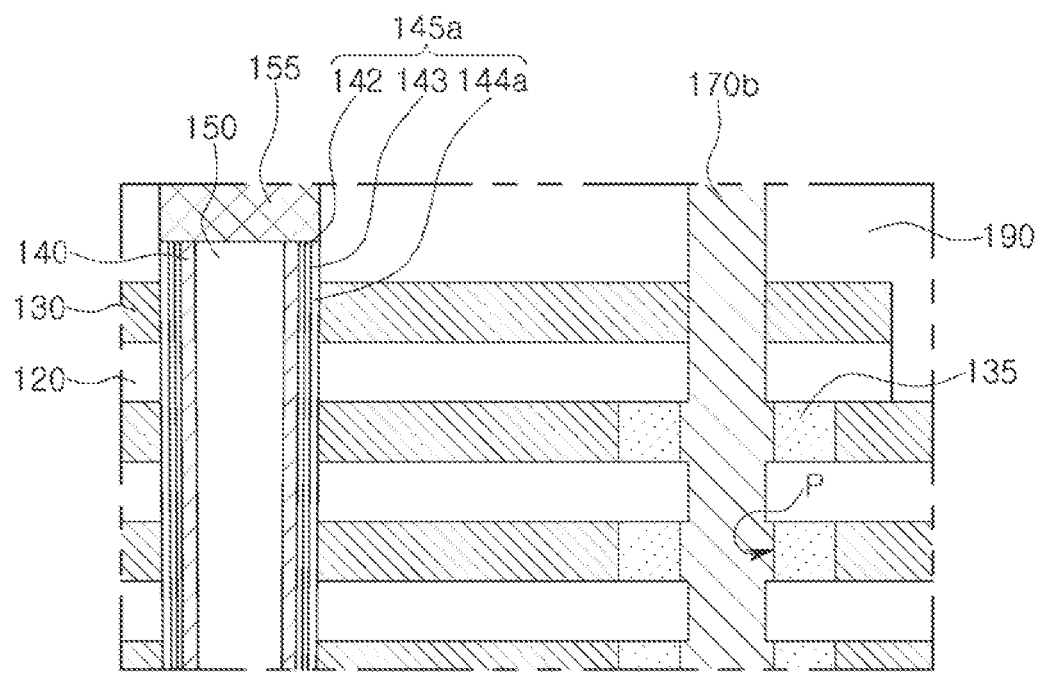

Referring to FIGS. 6C and 6D, a gate dielectric layer 145a may have a structure in which a tunneling layer 142, a charge storage layer 143, and a blocking layer 144a are sequentially stacked from the channel region 140. In the gate dielectric layer 145a, the tunneling layer 142, the charge storage layer 143, and the blocking layer 144a may be extended vertically along the channel CH.

Thus, a process of removing the blocking layer 144, described above, may be omitted, so the contact plug 170a may have an external side surface without a concave-convex portion, as illustrated in FIG. 6C. Alternatively, as illustrated in FIG. 6D, concave-convex portions P, protruding toward the insulating regions 135, may be included. For example, when a portion of the insulating region 135 is removed together, during removal of the sacrificial plug 189 (see FIG. 13H) formed prior to formation of the contact plug 170b, the contact plug 170b may have the structure described above. Alternatively, according to example embodiments of the present inventive concept, only concave-convex portions protruding toward the gate electrode 130 are formed, or concave-convex portions protruding toward all of the gate electrode 130 and the insulating regions 135 may be formed.

Figure 7A:
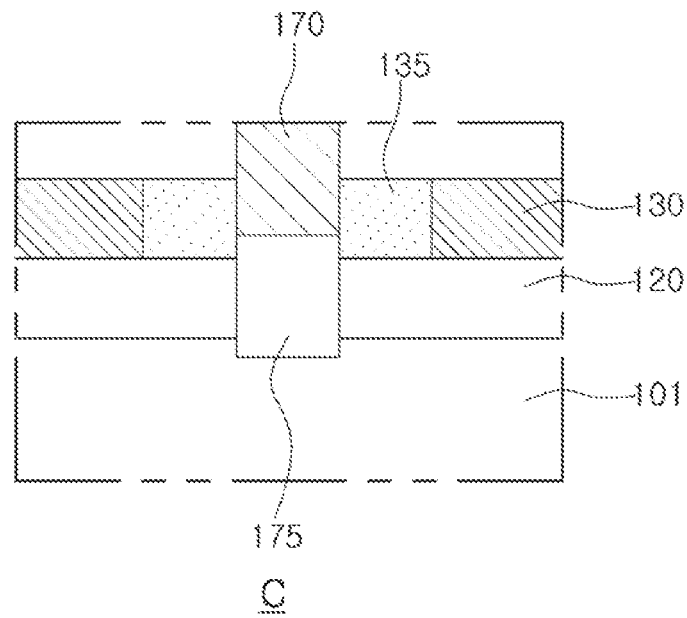
FIGS. 7A and 7B are schematic partially-enlarged views illustrating a semiconductor device according to example embodiments of the present inventive concept.
Figure 7B:
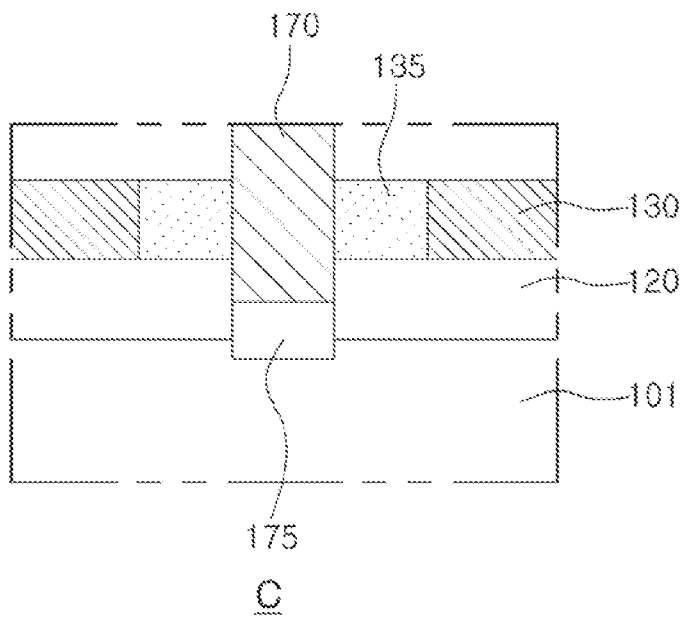

FIGS. 7A and 7B are schematic partially enlarged views illustrating a semiconductor device according to example embodiments of the present inventive concept. FIGS. 7A and 7B illustrate a region corresponding to region C of FIG. 4.

Referring to FIGS. 7A and 7B, the contact plug 170 may be electrically insulated from the substrate 101 by the substrate insulating layer 175 at a lower end. The substrate insulating layer 175 may be disposed in the form in which a portion of the substrate 101 is recessed, or may be disposed on an upper surface of the substrate 101.

The substrate insulating layer 175 may be extended into an interior of the insulating region 135, the most adjacent to the substrate 101, from the substrate 101, as illustrated in FIG. 7A. Thus, an upper surface of the substrate insulating layer 175 may be located higher than an interlayer insulating layer 120 in a lowermost portion, and a side surface of the substrate insulating layer may be at least partially surrounded by the interlayer insulating layer 120 and the insulating region 135. According to example embodiments of the present inventive concept, when the substrate insulating layer 175 is formed of a material the same as that of the insulating region 135 and/or the interlayer insulating layer 120, a boundary therebetween might not be clearly distinguishable.

As illustrated in FIG. 7B, the substrate insulating layer 175 may be extended into an interior of an interlayer insulating layer 120 in a lowermost portion. Thus, an upper surface of the substrate insulating layer 175 may be located on a level lower than an upper surface of the interlayer insulating layer 120 in a lowermost portion, and the contact plug 170 may be located on a level lower than a level of a lower surface of a gate electrode 130 in a lowermost portion.

Figure 8A:
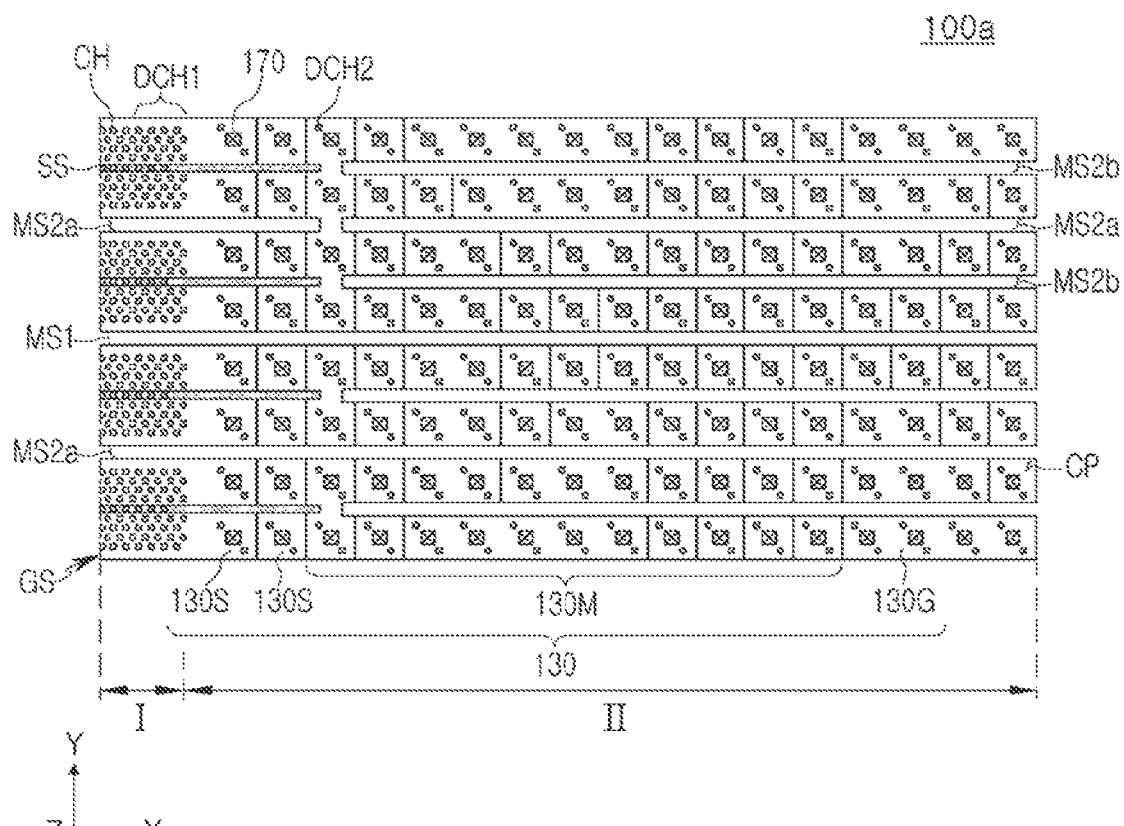
FIGS. 8A and 8B are schematic plan views illustrating a semiconductor device according to example embodiments of the present inventive concept.
Figure 8B:
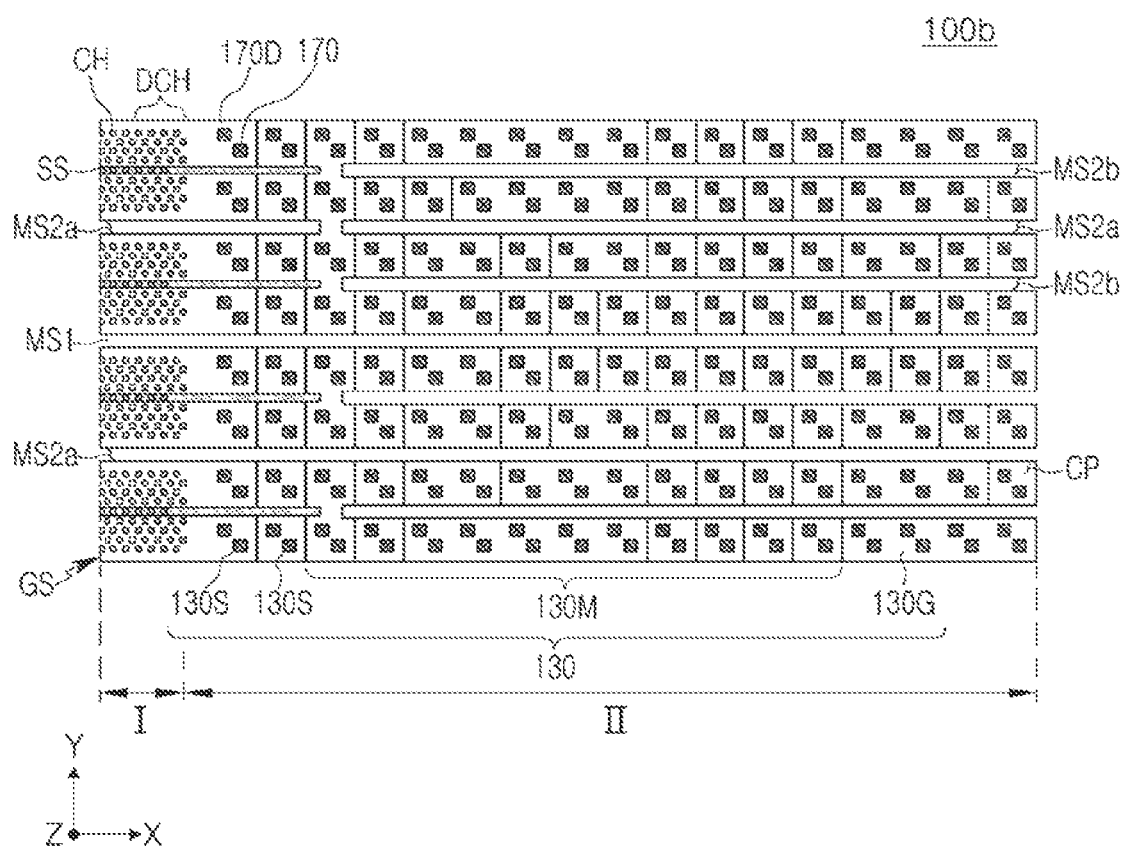

FIGS. 8A and 8B are schematic plan views illustrating a semiconductor device according to example embodiments of the present inventive concept.

Referring to FIG. 8A, a semiconductor device 100*a* may further include first dummy channels DCH1 and second dummy channels DCH2, in addition to the channels CH. The first dummy channels DCH1 and the second dummy channels DCH2 may pass through the stacked structure GS of the gate electrodes 130 in a manner similar to the channels CH, and may include a channel region 140 therein. However, the first dummy channels DCH1 and the second dummy channels DCH2 do not perform a channel function in the semiconductor device 100*a*, and may only be provided in a pattern to which an electrical signal is not applied.

The first dummy channels DCH1 may be arranged with the channels CH at an end of channels CH in the first region I. Thus, the first dummy channels DCH1 may have a size and shape that is the same as those of the channels CH, and may be arranged at a pitch and density that is the same as those of the channels CH.

The second dummy channels DCH2 may be arranged in the contact regions CP in the second region II, and may be arranged around the contact plugs 170. As illustrated in the drawings, the second dummy channels DCH2 may be two second dummy channels disposed around a single contact plug 170, by way of example. However, the number of the second dummy channels DCH2, disposed around the contact plug 170, may be variously changed in example embodiments of the present inventive concept. For example, three or less second dummy channels may be provided. The second dummy channels DCH2 may have a size and shape that is the same as or different from those of the channels CH, and may be arranged at a greater pitch and lower density than those of the first dummy channels DCH1. The second dummy channels DCH2 may support a stacking structure of the interlayer insulating layers 120 after the sacrificial layers 180 are removed from the second region II, during a manufacturing process (see FIG. 13I).

Referring to FIG. 8B, a semiconductor device 100*b* may further, include dummy channels DCH in addition to the channels CH, and may further include dummy contact plugs 170D in addition to the contact plugs 170.

The dummy channels DCH may be arranged with the channels CH at an end of channels CH in the first region I. Thus, in the same manner as the first dummy channels DCH1 of FIG. 8A, the dummy channels DCH may have a size and shape that is the same as those of the channels CH, and may be arranged at a pitch and density that is the same as those of the channels CH.

The dummy contact plugs 170D may be disposed in the contact regions CP with the contact plugs 170, in the second region II. The dummy contact plugs 170D may be arranged in a zigzag shape in the X-direction with the contact plugs 170. However, the arrangement of the dummy contact plugs 170D and the contact plugs 170 may be variously changed in consideration of a size of the contact region CP, a size of the dummy contact plugs 170D and the contact plugs 170, and the like. The dummy contact plugs 170D may have a size and structure that is the same as those of the contact plugs 170.

Rather than placing a dummy channel in the second region II, the dummy contact plugs 170D may be additionally disposed in the semiconductor device 100*b*. Thus, during the manufacturing process (see FIG. 13I), a stacking structure of the interlayer insulating layers 120 in the second region II may be supported.

Figure 9:
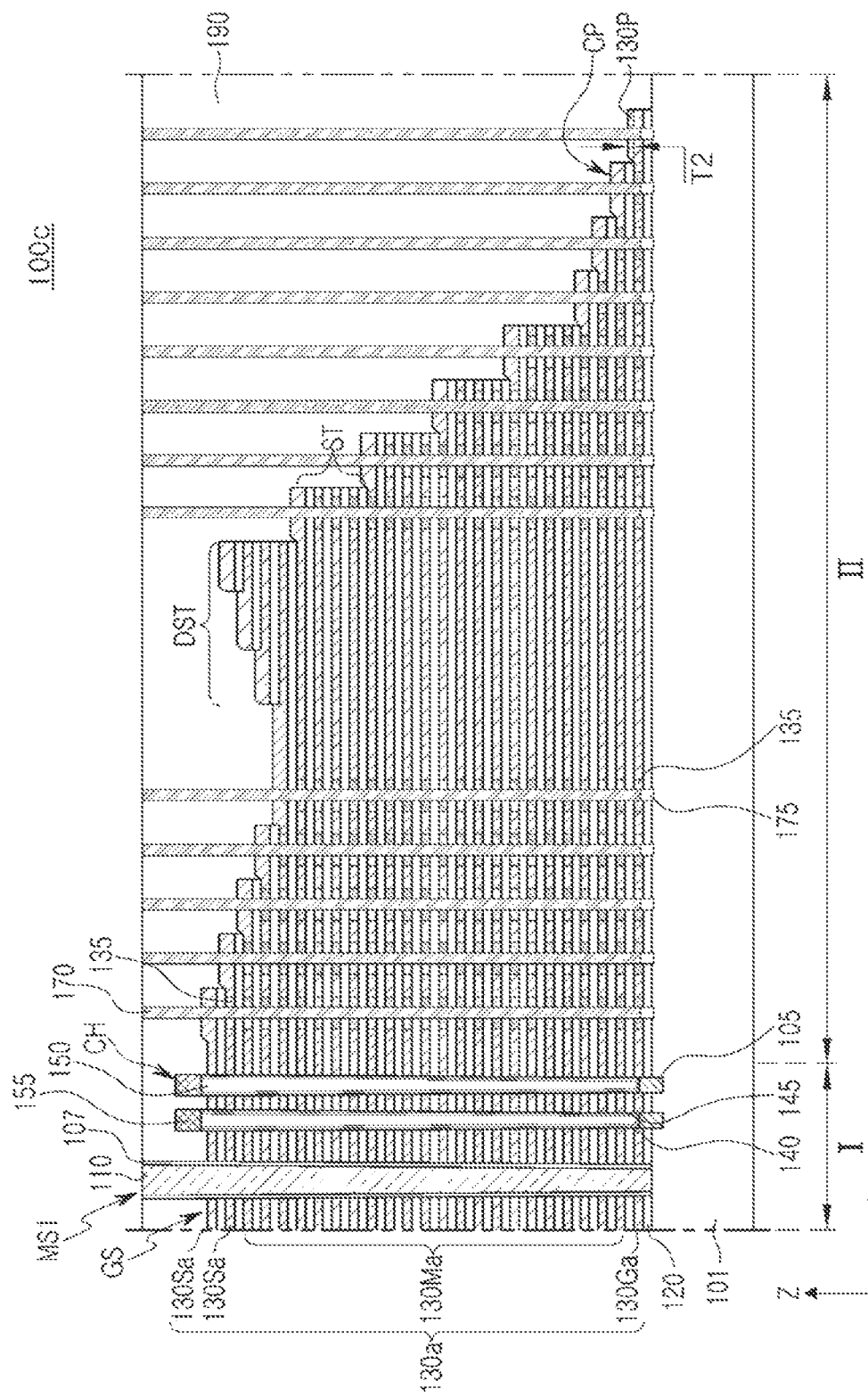
FIGS. 9 and 10 are schematic cross-sectional views illustrating a semiconductor device according to example embodiments of the present inventive concept.
Figure 10:
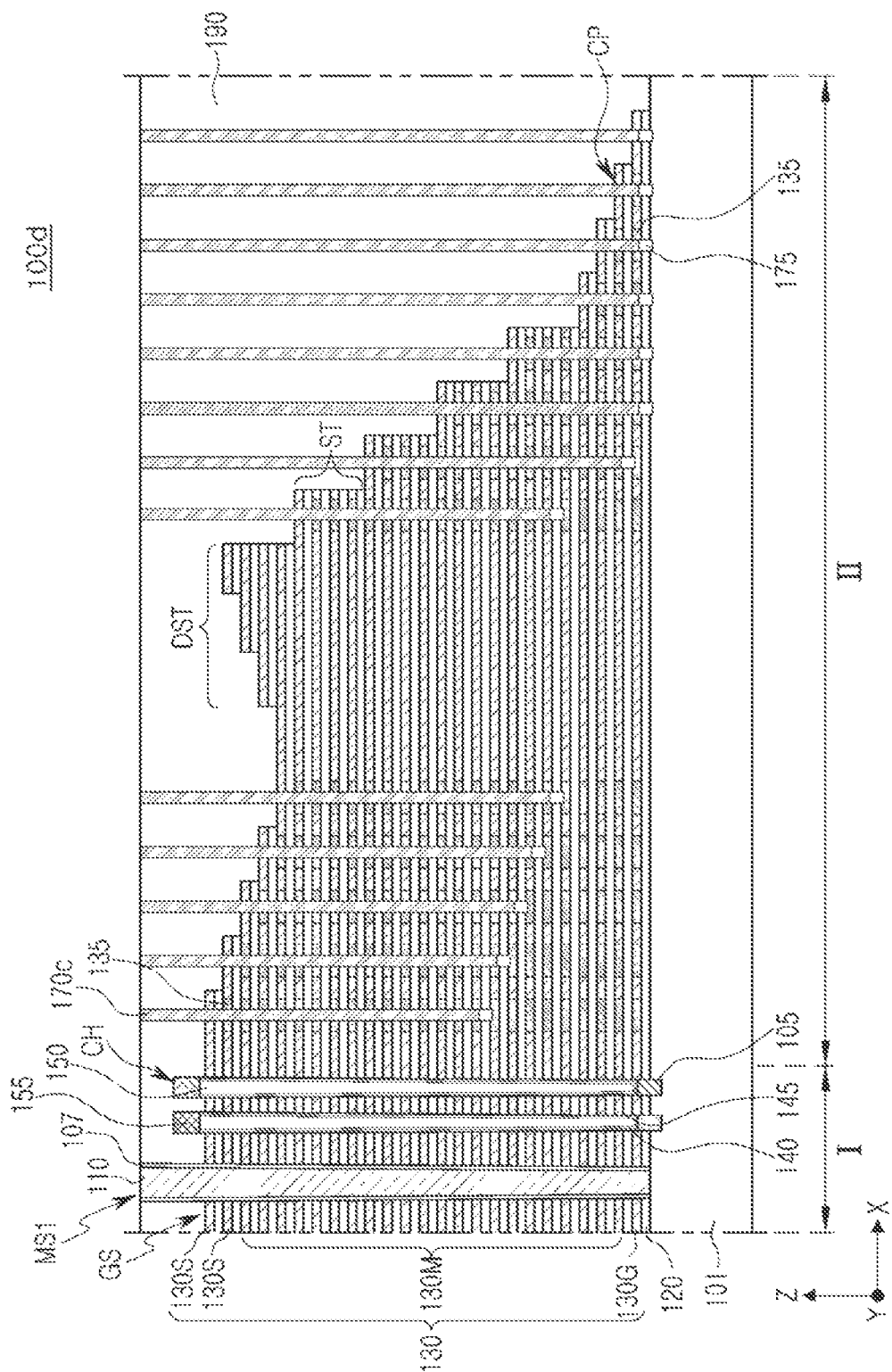

FIGS. 9 and 10 are schematic cross-sectional view illustrating a semiconductor device according to example embodiments of the present inventive concept.

Referring to FIG. 9, in a semiconductor device 100*c*, gate electrodes 130*a* may have a thickness that is increased in contact regions CP and regions exposed upwardly. The gate electrodes 130*a* may be extended from the first region I to the second region II to have a certain thickness, and a pad layer 130P may be further disposed on an upper surface in, exposed regions of the second region II. For example, a thickness T2 of the pad layer 130P may be smaller than a thickness of gate electrodes 130*a* that are below the pad layer 130P. According to example embodiments of the present inventive concept, the pad layer 130P may only be formed in portions of the gate electrodes 130*a*. A contact area of the gate electrodes 130*a* with the contact plugs 170 may be increased due to the pad layer 130P, and contact resistance thereof may be reduced.

Referring to FIG. 10, in a semiconductor device 100*d*, contact plugs 170*c* may have different lengths. The contact plugs 170*c* may pass through the cell region insulating layer 190 from an upper portion and may be extended toward the substrate 101, and at least a portion of the contact plugs 170*c* might not pass through at least one gate electrode 130 in a lower region adjacent to the substrate 101.

For example, the contact plugs 170*c* may only pass through the n number (where n is a positive integer) of gate electrodes 130 from an upper portion of the stacked structure GS. Thus, when the number of gate electrodes 130 stacked on the substrate 101, is smaller than n in the contact region CP, the contact plug 170*c* disposed in the contact region CP may pass through the entirety of the gate electrodes 130. However, when the number of gate electrodes 130 stacked on the substrate 101, is greater than n in the contact region CP, the contact plug 170*c* disposed in the contact region CP may only pass through the n number of the gate electrodes 130 from an upper portion. However, in example embodiments of the present inventive concept, the contact plugs 170*c* may pass through the similar number of gate electrodes 130, and it is not limited to only passing through exactly n gate electrodes 130.

The structure of the contact plugs 170*c* described above may be generated by different etching degrees depending on the number of stacked layers, during formation of through holes (see FIG. 13D) for formation of contact plugs 170*c*. In example embodiments of the present inventive concept, when the through holes are formed by a predetermined forming unit, the contact plugs 170*c* may have different lengths depending on the forming unit. Thus, in this case, the contact plugs 170*c* may be formed to have different lengths for each predetermined group.

Figure 11A:
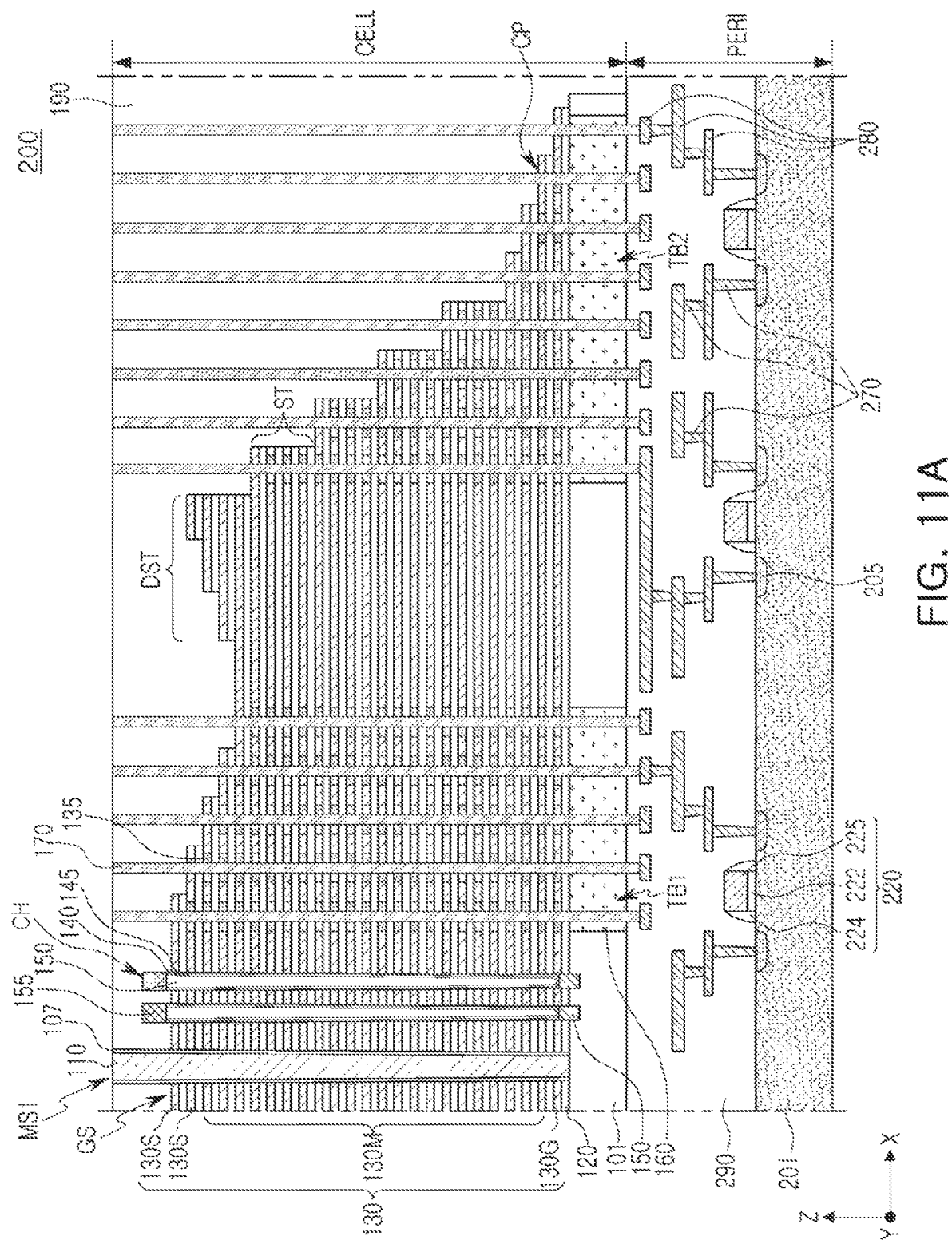
FIGS. 11A and 11B are schematic cross-sectional views illustrating a semiconductor device according to example embodiments of the present inventive concept.
Figure 11B:
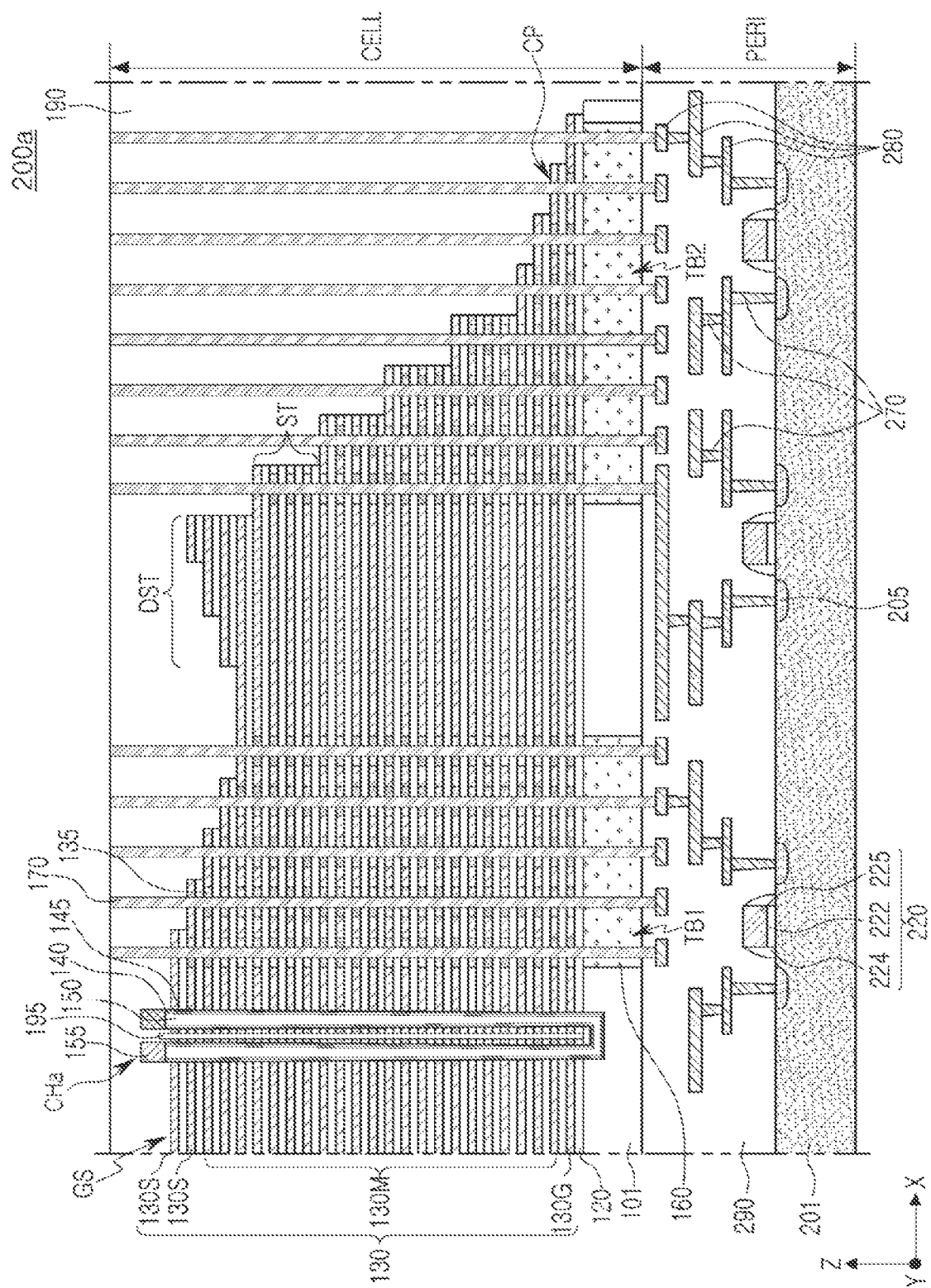

FIGS. 11A and 11B are schematic cross-sectional views illustrating a semiconductor device according to example embodiments of the present inventive concept.

Referring to FIG. 11A, a semiconductor device 200 may include a memory cell region CELL and a peripheral circuit region PERI. The memory cell region CELL may be disposed on an upper end of the peripheral circuit region PERI. In example embodiments of the present inventive concept, on the other hand, the cell region CELL may be disposed on a lower end of the peripheral circuit region PERI.

The memory cell region CELL may include, as illustrated with reference to FIGS. 3 and 4, a substrate 101, gate electrodes 130 stacked on the substrate 101, channels CH passing through the stacked structure GS of the gate electrodes 130, and contact plugs 170 connected to the gate electrodes 130. The memory cell region CELL may have a structure according to various example embodiments of the present inventive concept as described above with reference to FIGS. 6A to 10. For example, the memory cell region CELL may further include a first wiring region TB1 and a second wiring region TB2, passing through the substrate 101 and connected to the peripheral circuit region PERI.

The peripheral circuit region PERI may include a base substrate 201, circuit elements 220 disposed on the base substrate 201, as well as circuit contact plugs 270 and wiring lines 280.

The base substrate 201 may have an upper surface extending in the X- and Y-directions. The base substrate 201 may have separate element isolation layers formed therein such that an active region may be defined. A portion of the active region may have source/drain regions 205 disposed therein and including impurities. The base substrate 201 may include a semiconductor material, such as a Group IV semiconductor, a Group III-V compound semiconductor, and/or a Group II-VI compound semiconductor.

The circuit elements 220 may include a planar transistor. Each of the circuit elements 220 may include a circuit gate insulation layer 222, a spacer layer 224, and a circuit gate electrode 225. The source/drain regions 205 may be disposed in the base substrate 201 at both sides of the circuit gate electrode 225.

The peripheral region insulating layer 290 may be disposed on the circuit element 220 on the base substrate 201. The circuit contact plugs 270 may pass through the peripheral region insulating layer 290 and may be connected to the source/drain regions 205. The circuit contact plugs 270 may allow an electrical signal to be applied to the circuit element 220. The circuit contact plugs 270 may be connected to the circuit gate electrode 225. The wiring lines 280 may be connected to the circuit contact plugs 270, and may be disposed in a plurality of layers.

In the semiconductor device 200, after the peripheral circuit region PERI is manufactured first, a substrate 101 of the memory cell region CELL may be formed thereabove to manufacture the memory cell region CELL. The substrate 101 may have the same size as the base substrate 201, or may be smaller than the base substrate 201.

As illustrated in FIG. 11A, the gate electrodes 130 of the memory cell region CELL may be electrically connected to the circuit elements 220 of the peripheral circuit region PERI through the contact plugs 170. The contact plugs 170 may pass through the gate electrodes 130 and the substrate 101 in the first wiring region TB1 and the second wiring region TB2 to extend downwardly. The first wiring region TB1 and the second wiring region TB2 may include a through insulating layer 160 passing through the substrate 101. The contact plugs 170 may be extended into an interior of the through insulating layer 160 and may be connected to wiring lines 280 of the peripheral circuit region PERI. The first wiring region TB1 and the second wiring region TB2 are illustrated as being separated into two regions, but, are not limited thereto. For example, the first wiring region TB1 and the second wiring region TB2 may be a single region, or may be separately disposed for each of the contact plugs 170.

Referring to FIG. 11B, in a semiconductor device 200a, in a manner different from an example embodiment of the present disclosure illustrated in FIG. 11A, a channel CHa may have a U-shape. The channel CHa may pass through the stacked structure GS of the gate electrodes 130 and may have a bent form in the substrate 101. The channel CHa may include a channel region 140, a gate dielectric layer 145, a channel insulating layer 150, and a channel pad 155. The channel region 140, the gate dielectric layer 145, and the channel insulating layer 150 may also be disposed in the U-shape. A separation insulating layer 195 may be further disposed in a gap between portions of the channel CHa having a bent form.

Moreover, in the semiconductor device 200a, in a manner different from the example embodiment of the present disclosure illustrated in FIG. 11A, the source conductive layer 110 does not extend toward the substrate 101, and may be disposed in an upper portion of the channel CHa.

Figure 12:
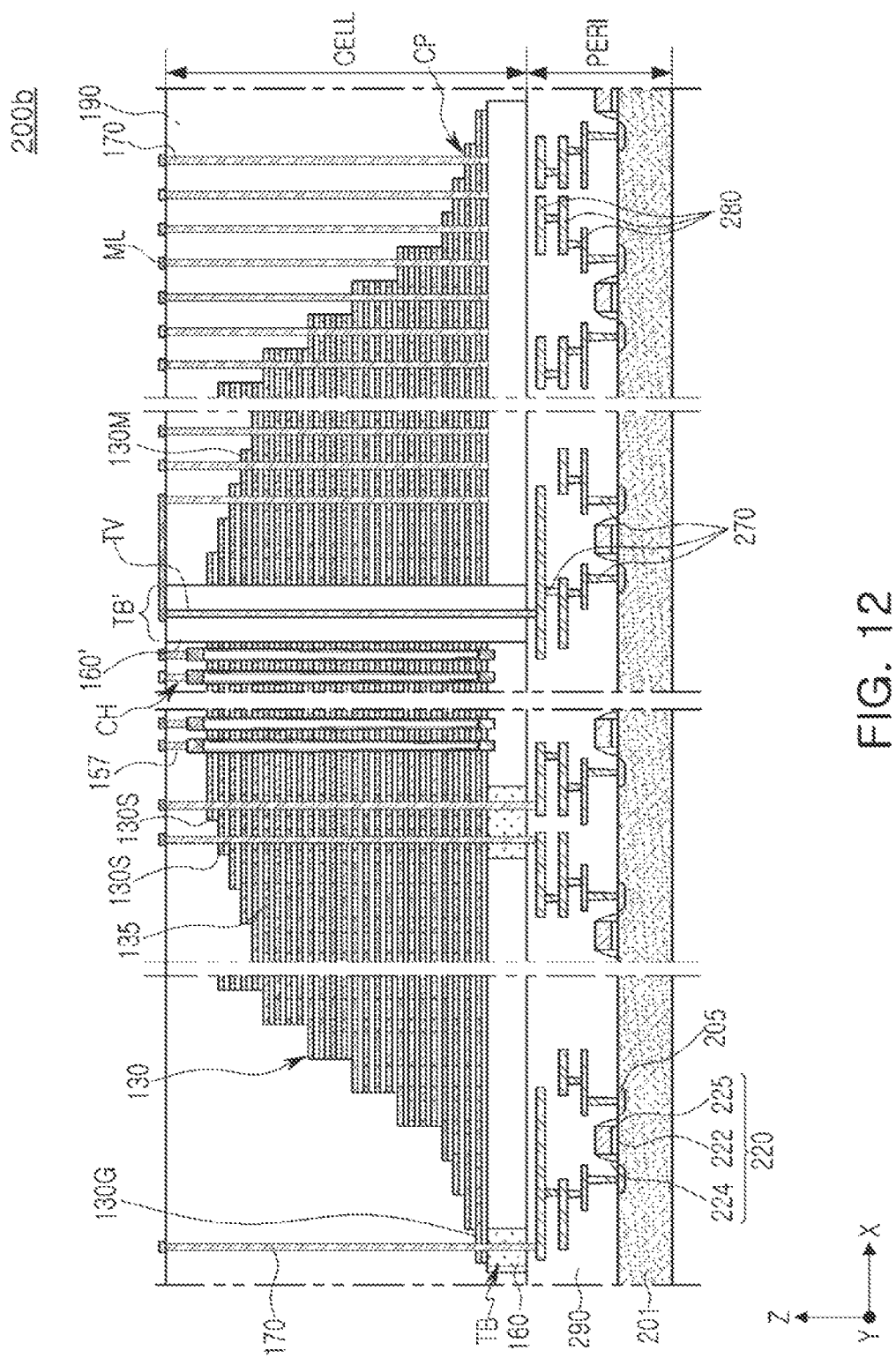
FIG. 12 is a schematic cross-sectional view illustrating a semiconductor device according to example embodiments of the present inventive concept.

FIG. 12 is a schematic cross-sectional view illustrating a semiconductor device according to example embodiments of the present inventive concept.

Referring to FIG. 12, in a semiconductor device 200b, one portion of the gate electrodes 130 may be connected to the peripheral circuit region PERI through a through wiring region TB", and the other portion may be connected to the peripheral circuit region PERI through the contact plugs 170 in a wiring region TB.

For example, in contact regions CP in one side of the channels CH, memory gate electrodes 130M may be electrically connected to the peripheral circuit region PERI through the contact plugs 170, the wiring lines ML, and the through via TV in the through wiring region TB'. In the contact regions CP in the other side, upper gate electrodes 130S and lower gate electrodes 130G may be electrically connected to the peripheral circuit region PERI by the contact plugs 170, passing through the stacked structure GS and the substrate 101. As described above, at least a portion of the gate electrodes 130 may be connected to the peripheral circuit region PERI, in different forms. The through wiring region TB may be a region passing through the gate electrodes 130 and the substrate 101. The through wiring region TB' may be filled with the through insulating layer 160', and at least one through via TV passing therethrough may be disposed therein. Moreover, the channels CH may be connected to wiring lines ML in an upper portion through a channel plug 157.

In example embodiments of the present inventive concept, the arrangement relationship of the memory cell region CELL and the peripheral circuit region PERI is not necessarily limited to being arranged vertically as described above.

FIGS. 13A to 13K are schematic cross-sectional views illustrating a method for manufacturing a semiconductor device according to example embodiments of the present inventive concept. FIGS. 13A to 13K illustrate a region corresponding to FIG. 4.

Figure 13A:
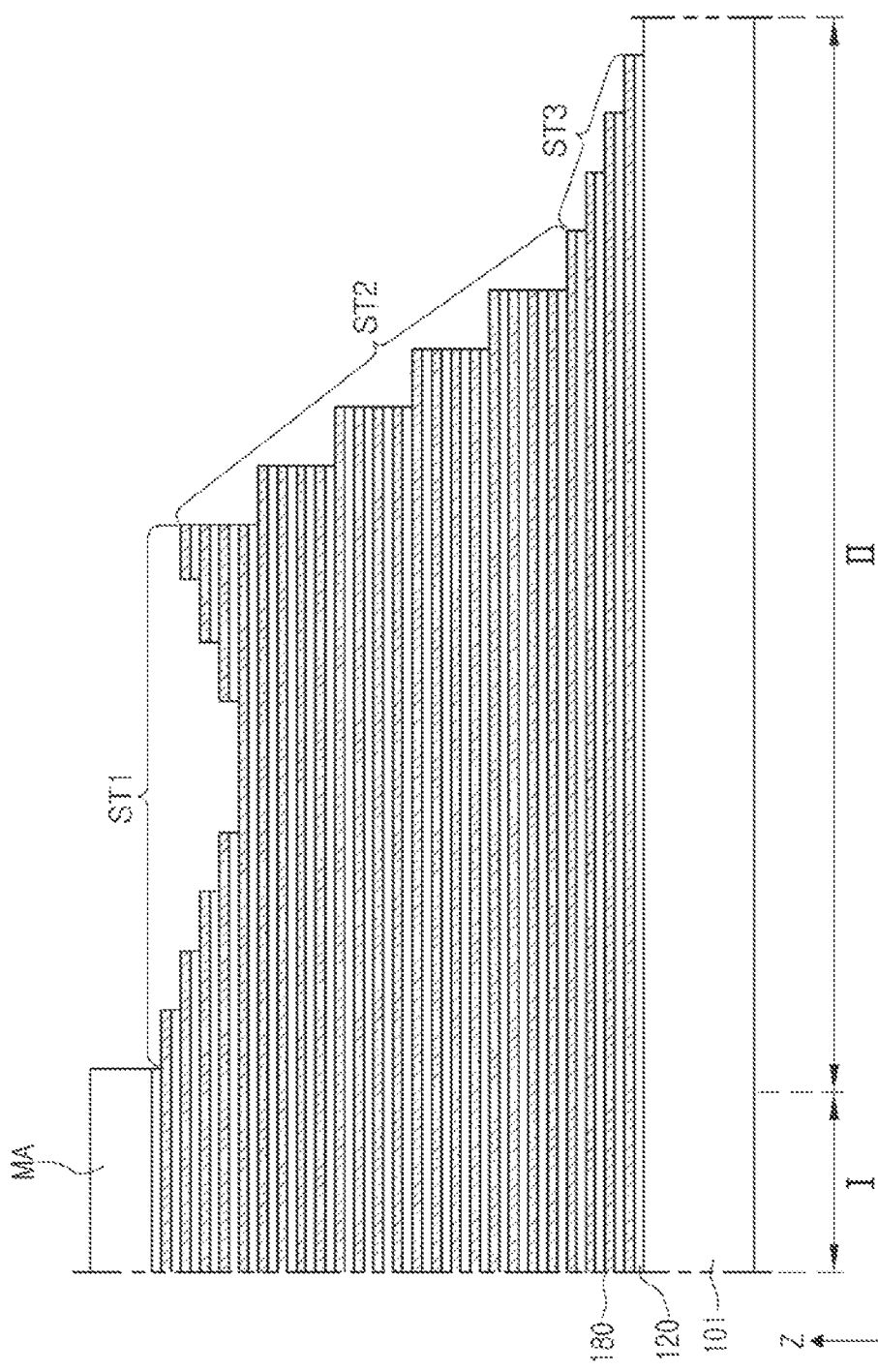

Referring to FIG. 13A, sacrificial layers 180 and interlayer insulating layers 120 may be alternately stacked on a substrate 101, and a portion of the sacrificial layers 180 and the interlayer insulating layers 120 may be removed to allow the sacrificial layers 180 to be extended by different lengths in the X-direction.

The sacrificial layers 180 may be replaced with gate electrodes 130 (see FIG. 4) through a subsequent process. The sacrificial layers 180 may be formed of a material different from that of the interlayer insulating layers 120, and may be formed of a material that may be etched with etch selectivity for the interlayer insulating layers 120 under certain etching conditions. For example, the interlayer insulating layer 120 may include silicon oxide and/or silicon nitride, and the sacrificial layers 180 may include silicon, silicon oxide, silicon carbide, and/or silicon nitride, and may be different from that of the interlayer insulating layer 120. In example embodiments of the present inventive concept, all of thicknesses of the interlayer insulating layers 120 might not be the same. For example, an interlayer insulating layer 120 in a lowermost portion may be relatively thin, and an interlayer insulating layer 120 in an uppermost portion may be relatively thick. The thicknesses of the interlayer insulating layers 120 and the sacrificial layers 180 and the number of films forming the same may be variously changed from those illustrated in the drawings.

In the second region II, sacrificial layers 180 in an upper portion are extended by a shorter distance than sacrificial layers 180 in a lower portion, a photolithography process and an etching process for the sacrificial layers 180 may be repeatedly performed using the mask layer MA. Thus, the sacrificial layers 180 may have a stepped form. The sacrificial layers 180 may include an upper stack ST1, an intermediate stack ST2, and a lower stack ST3. The upper stack ST1 may include a dummy stack at a boundary with the intermediate stack ST2, and the number of sacrificial layers 180, forming the intermediate stack ST2, may be increased and decreased depending on the number of gate electrodes 130 to be formed. The upper stack ST1 and the lower stack ST3 may be lowered by a first stepped portion in the X-direction, and the intermediate stack ST2 may be lowered by a second stepped portion, greater than the first stepped portion. In example embodiments of the present inventive concept, the number of the sacrificial layers 180, forming the stacks ST1, ST2, and ST3, a size of the stepped portion, and the like, may be variously changed.

Referring to FIG. 13B, impurities may be implanted into the sacrificial layers 180 in an upper portion, and thus impurity regions 185 may be formed.

The impurities may be implanted into regions of the sacrificial layers 180, exposed upwardly due to a stepped portion, so that the sacrificial layers 180 may be changed into the impurity regions 185 in an end portion. The impurities may be a material allowing the impurity regions 185 to have etch selectivity with the sacrificial layers 180 under certain etchants or specific etching conditions. For example, the impurities may include hydrogen (H), nitrogen (N), carbon (C), and/or boron (B). In example embodiments of the present inventive concept, the impurity regions 185 might not include impurities, and may simply be a layer whose physical properties are changed from the sacrificial layers 180.

The impurities may be implanted by an ion implantation process. By controlling energy of implantation of an ion during the ion implantation process, impurities may only be implanted into sacrificial layers 180, exposed upwardly, among the sacrificial layers 180, for example, sacrificial layers 180 in an uppermost portion in respective regions.

Figure 13C:
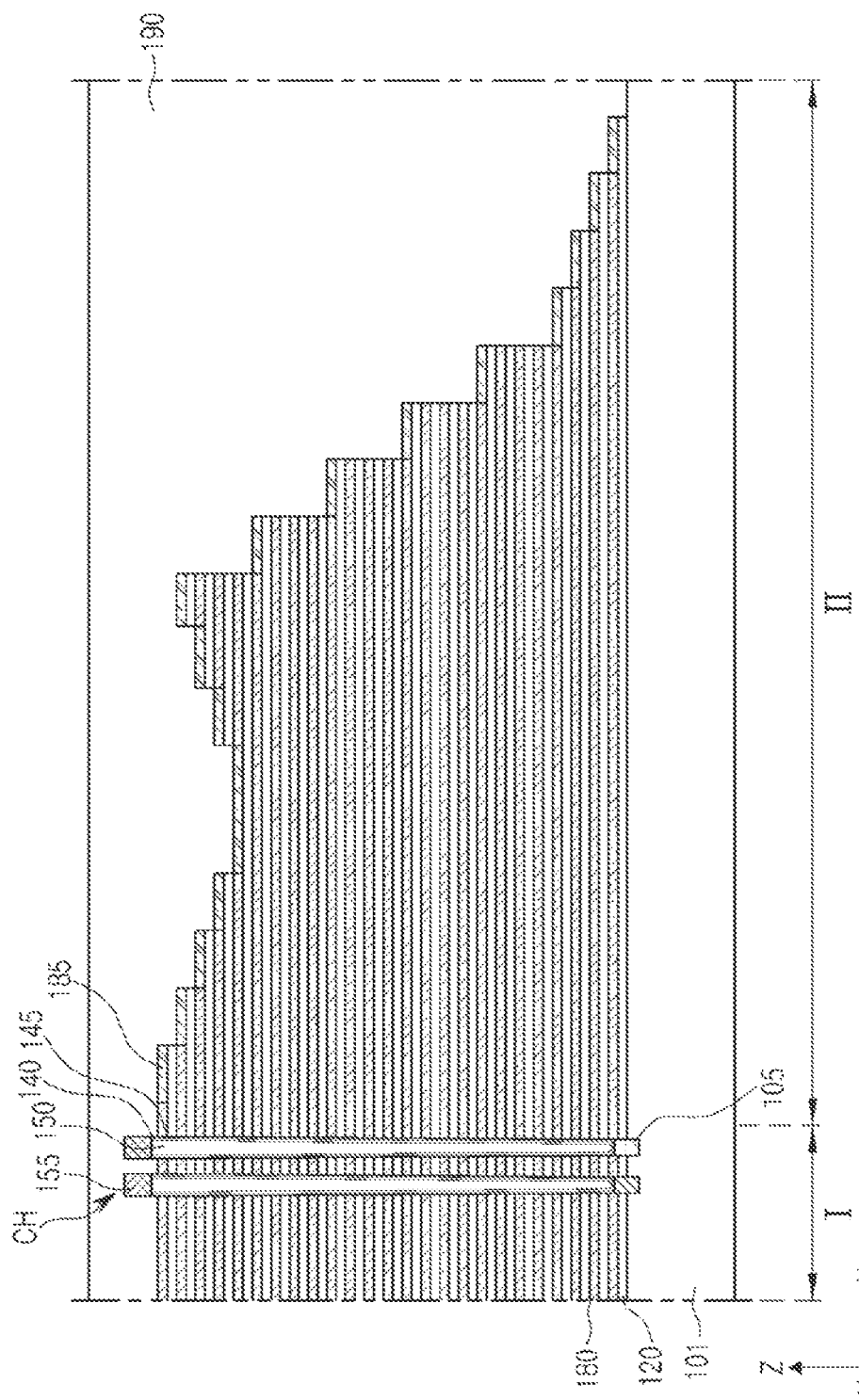

Referring to FIG. 13C, channels CH, passing through a stacked structure of the sacrificial layers 180 and the interlayer insulating layers 120, may be formed.

First, a cell region insulating layer 190, covering an upper portion of the stacked structure of the sacrificial layers 180 and the interlayer insulating layers 120, may be formed, and a portion of the sacrificial layers 180 and the interlayer insulating layers 120 is removed to form a string separation region SS (see FIG. 3). A region, in which the string separation region SS is to be formed using a separate mask layer, is exposed, the predetermined number of the sacrificial layers 180 and the interlayer insulating layers 120 is removed from an uppermost portion, and an insulating material is then deposited, so the string separation region SS may be formed. The string separation region SS may be extended further down as compared with a region in which the upper gate electrodes 130S of FIG. 4 is to be formed.

The channels CH may be formed by anisotropically etching the sacrificial layers 180 and the interlayer insulating layers 120, and may have the form of a hole. Due to a height of the stacked structure, side walls of the channels CH might not be perpendicular to an upper surface of the substrate 101. In example embodiments of the present inventive concept, the channels CH may be formed to allow a portion of the substrate 101 to be recessed. Then, in the channels CH, the epitaxial layer 105, at least a portion of the gate dielectric layer 145, the channel region 140, the channel insulating layer 150, and the channel pads 155 may be formed. When dummy channels, additionally disposed in addition to the channels CH, are formed, the dummy channels may be formed with the channels CH in the operation described above.

The epitaxial layer 105 may be formed using a selective epitaxial growth (SEG) process. The epitaxial layers 105 may include a single layer or a plurality of layers. The epitaxial layers 105 may contain polycrystalline silicon (Si), single crystalline Si, polycrystalline germanium (Ge) and/or single crystalline Ge, that may doped with impurities or not doped.

The gate dielectric layer 145 may have a uniform thickness by using atomic layer deposition (ALD) or chemical vapor deposition (CVD). In the operation described above, the gate dielectric layer 145 may be formed in whole or part, and a portion of the gate dielectric layer may extend perpendicular to the substrate 101 along the channels CH. The channel region 140 may be formed on the gate dielectric layer 145 in the channels CH. The insulating layer 150 may fill the channels CH, and may be an insulating material. However, according to example embodiments of the present inventive concept, rather than the channel insulating layer 150, a conductive material may fill a gap of the channel region 140. The channel pad 155 may be formed of a conductive material, for example, polycrystalline silicon.

Figure 13D:
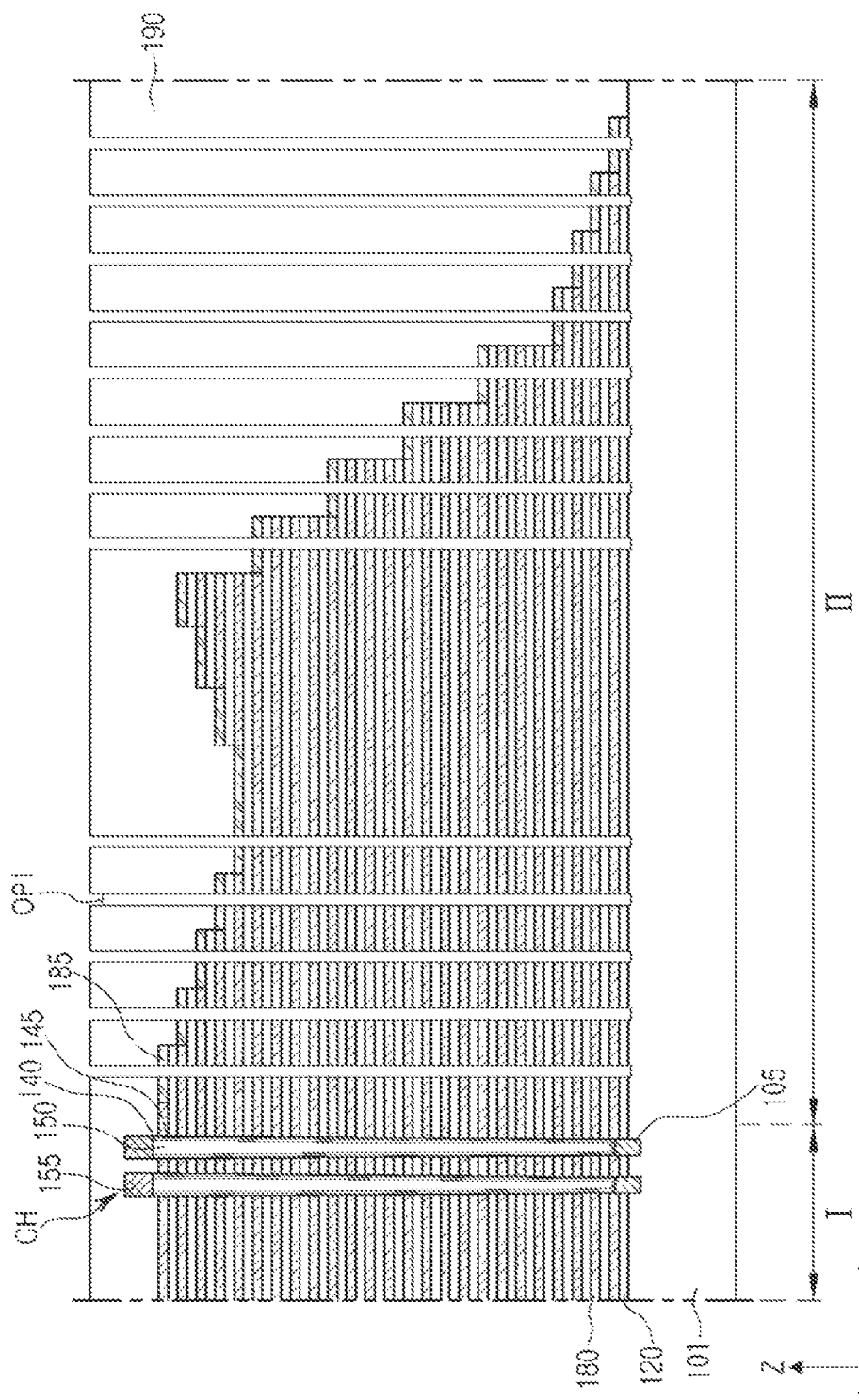

Referring to FIG. 13D, first openings OP1 may be formed in a region in which the contact plugs 170 (see FIG. 4) are to be formed.

The first openings OP1 may be formed by anisotropically etching the sacrificial layers 180 and the interlayer insulating layers 120, and may have the form of a hole. Due to a height of the stacked structure, a side wall of the first openings OP1 might not be perpendicular to an upper surface of the substrate 101. The first openings OP1 may be formed to recess a portion of the substrate 101, or to expose an upper surface of the substrate 101.

Figure 13E:
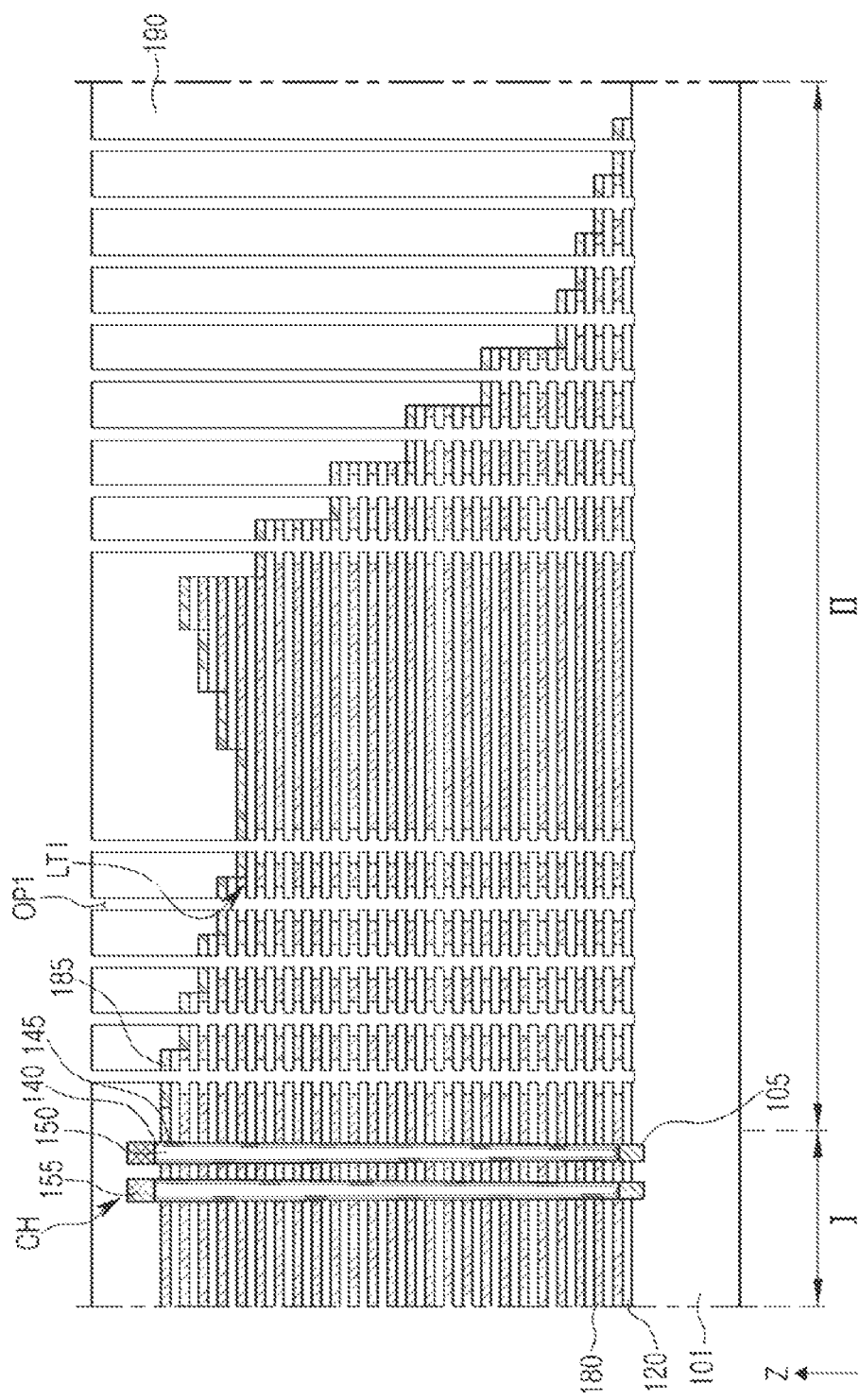

Referring to FIG. 13E, a portion of the sacrificial layers 180, exposed through the first openings OP1, may be removed.

A portion of the sacrificial layers 180 may be removed using, for example, a wet etching process. The sacrificial layers 180 are selectively removed with respect to the interlayer insulating layers 120 and the impurity regions 185, so the interlayer insulating layers 120 and the impurity regions 185 may remain without being removed. Thus, first tunnel portions LT1, horizontally extended between the interlayer insulating layers 120 from the first openings OP1, may be formed. The first tunnel portions LT1 may be extended in substantially the same length from the first openings OP1.

Figure 13F:
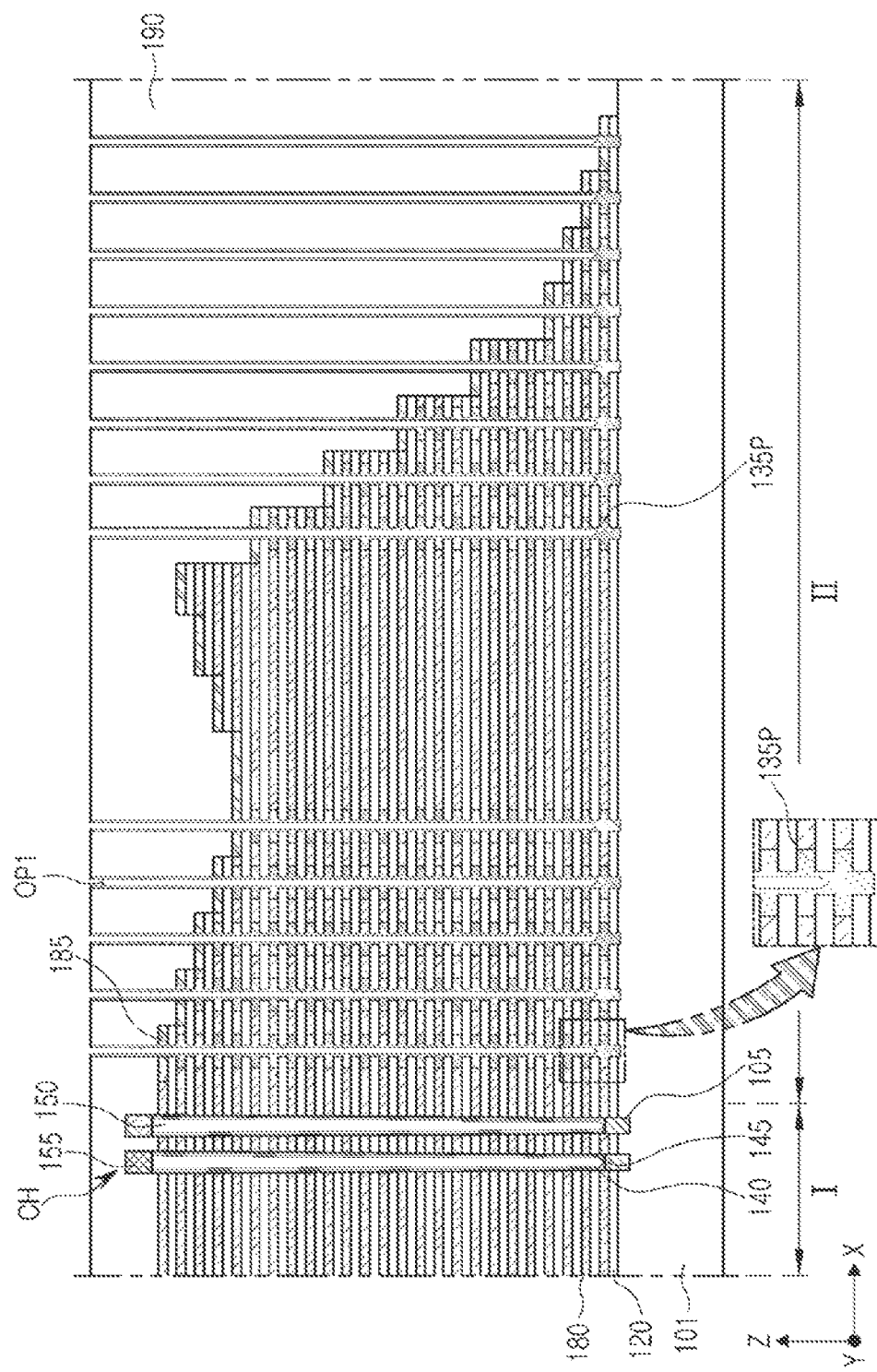

Referring to FIG. 13F, an insulating region material 135P may be deposited in the first openings OP1 and the first tunnel portions LT1.

The insulating region material 135P may fill the first tunnel portions LT1 and may be deposited on a side wall of the first openings OP1. The insulating region material 135P may be a layer on which the insulating regions 135 and the substrate insulating layers 175 of FIG. 4 are ultimately formed through a subsequent process.

As enlarged and illustrated in FIG. 13F, the insulating region material 135P might not be deposited with a uniform thickness along a lower surface of the first openings OP1, for example, at a lower end of the first openings OP1, and may be deposited in the form filling a lower end to a predetermined height. For example, the insulating region material 135P may be filled higher than the sacrificial layer 180 in a lowermost portion at a lower end of the first openings OP1.

Figure 13G:
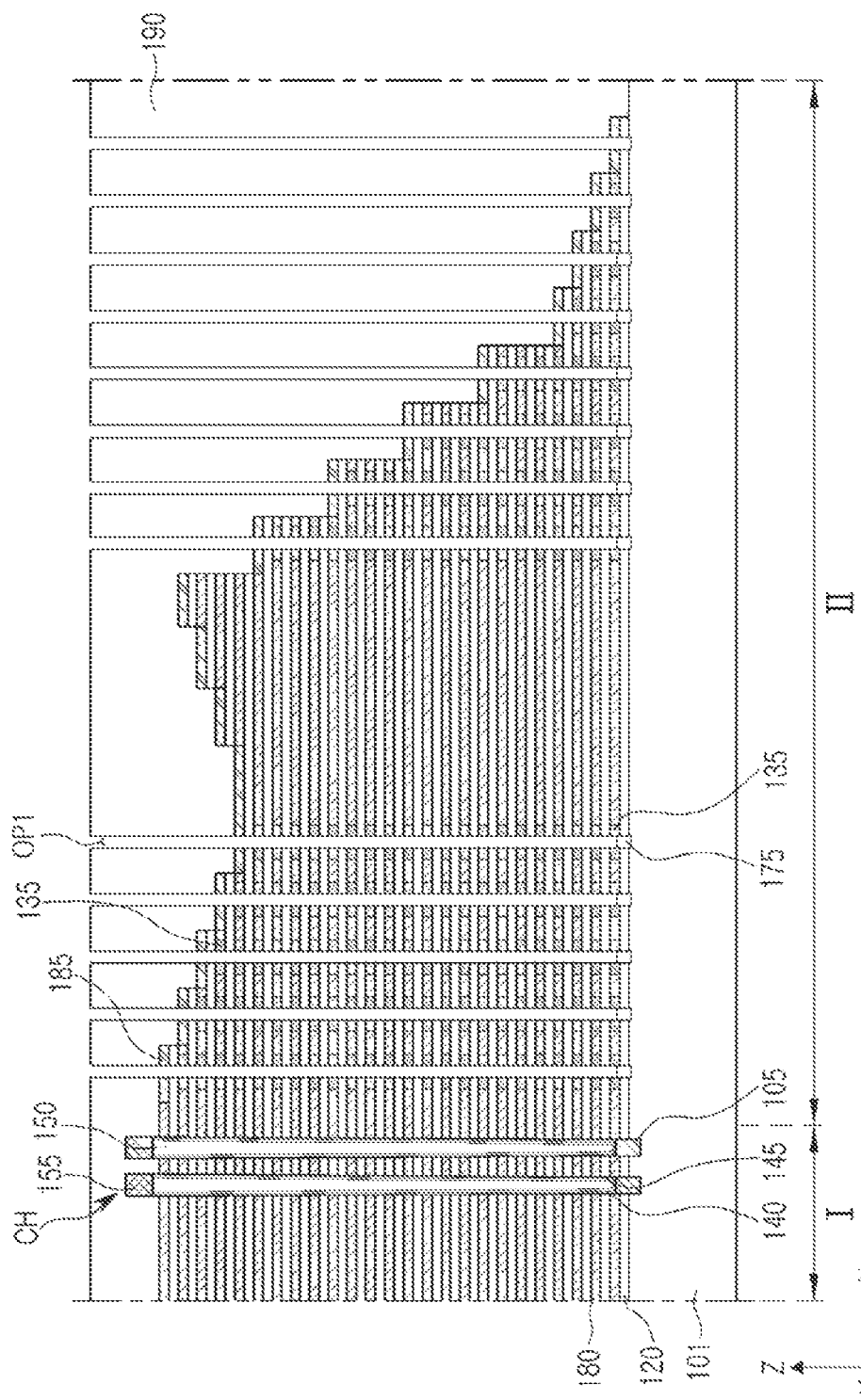

Referring to FIG. 13G, a portion of the insulating region material 135P ma be removed from the first openings OP1, thereby forming insulating regions 135 and substrate insulating layers 175.

A process of removing the insulating region material 135P may be performed using, for example, a wet etching process. Due to the removal process, the insulating region material 135P may be removed from an inside wall of the first openings OP1, and the insulating region material 135P might only remain in the first tunnel portions LT1 to form insulating regions 135. The insulating region material 135P might remain only on the substrate 101 at a lower end of the first openings OP1 to form substrate insulating layers 175. An upper surface of the substrate insulating layers 175 may be located higher than an upper surface of the substrate 101, and may be located higher than an interlayer insulating layer 120 in a lowermost portion, by way of example.

Figure 13H:
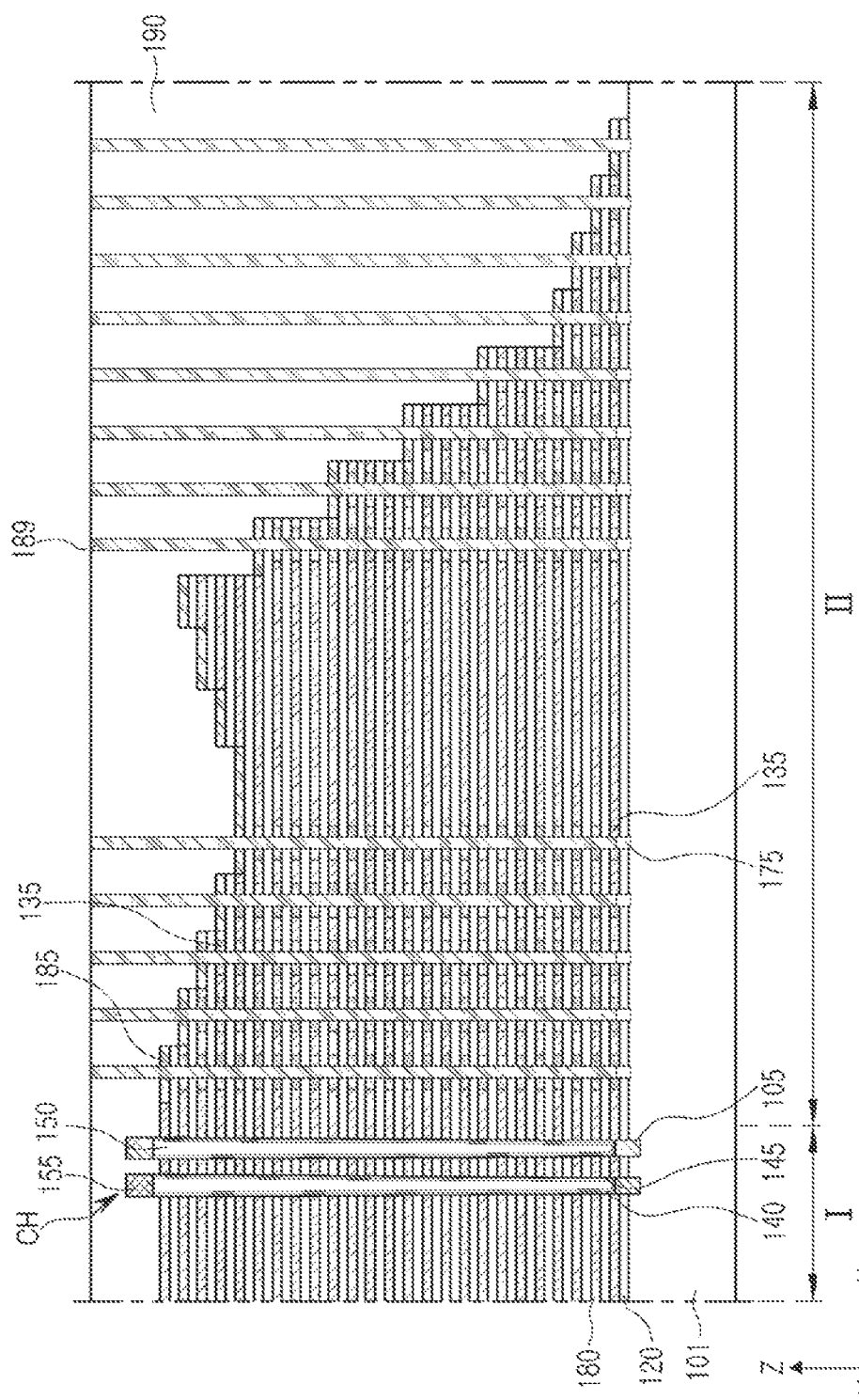

Referring to FIG. 13H, the first openings OP1 may be filled with a material to form sacrificial plugs 189.

The sacrificial plugs 189 may be formed of a material different from the cell region insulating layer 190 and a source conductive layer 110 (see FIG. 4), formed in a subsequent process. For example, the sacrificial plugs 189 may be formed of polycrystalline silicon. The sacrificial plugs 189 may be formed to protect layers exposed through the first openings OP1, during a subsequent process.

Figure 13I:
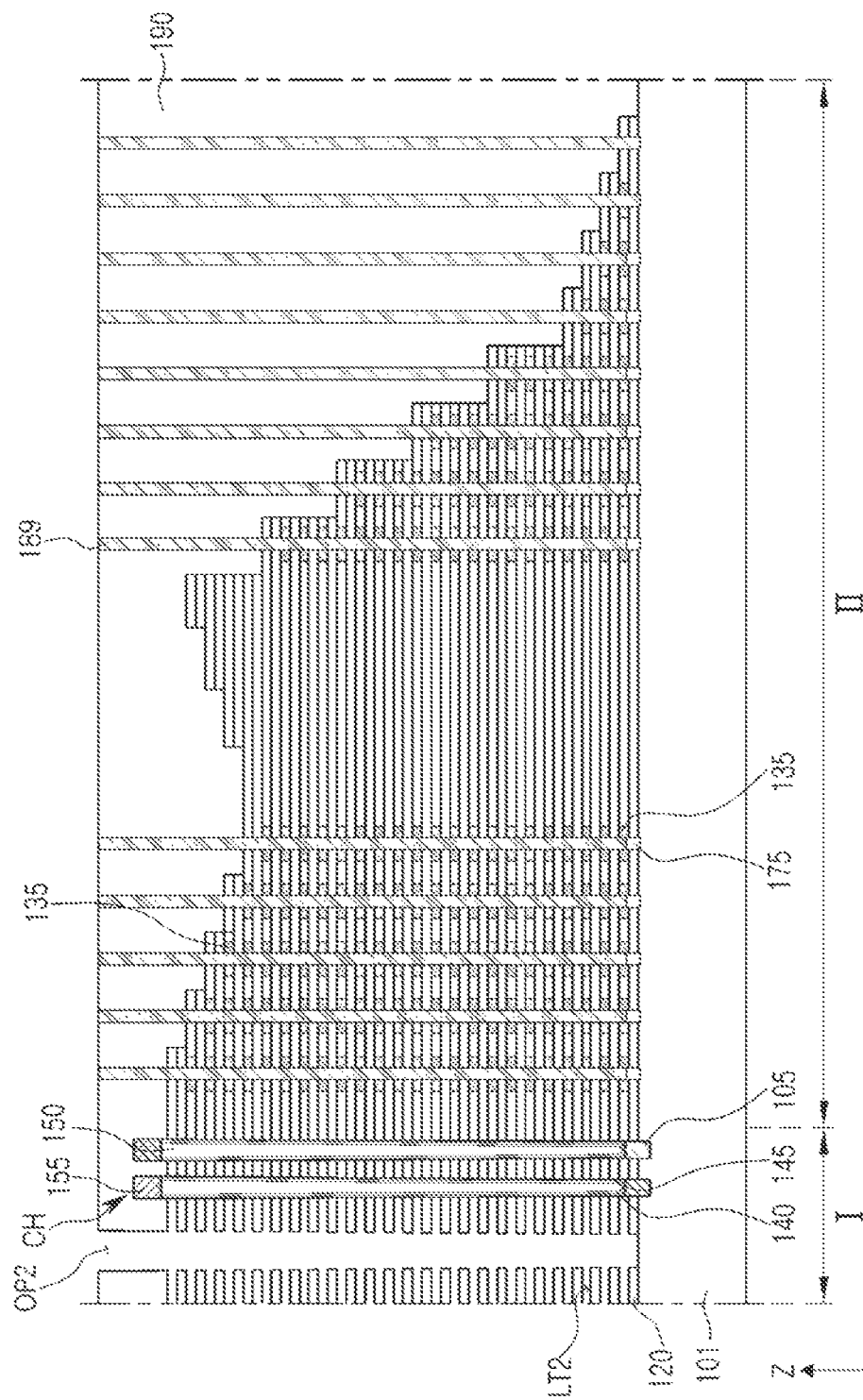

Referring to FIG. 13I, second openings OP2, passing through a stacked structure of the sacrificial layers 180 and the interlayer insulating layers 120, may be formed, and the sacrificial layers 180 and the impurity regions 185 may be removed through the second openings OP2.

The second openings OP2 may be formed at positions of the first separation regions MS1 and the second separation regions MS2a and MS2b of FIG. 3. The second openings OP2 may be formed by forming a mask layer using a photolithography process and anisotropically etching the stacked structure. The second openings OP2 may be formed in the form of a trench extended in the Y-direction, and the substrate 101 may be exposed in a lower portion of the second openings OP2.

The sacrificial layers 180 and the impurity regions 185 may be selectively removed with respect to the interlayer insulating layers 120, using, for example, wet etching. Thus, a plurality of second tunnel portions LT2 may be formed between the interlayer insulating layers 120, and some side walls of the gate dielectric layer 145 of the channels CH and side surfaces of the insulating regions 135 may be exposed through the second tunnel portions LT2. In the operation described above, after the sacrificial layers 180 and the impurity regions 185 are removed, stability of a stacked structure of the interlayer insulating layer 120 may be reduced, but the stacked structure may be further stably supported by the sacrificial plugs 189.

Figure 13J:
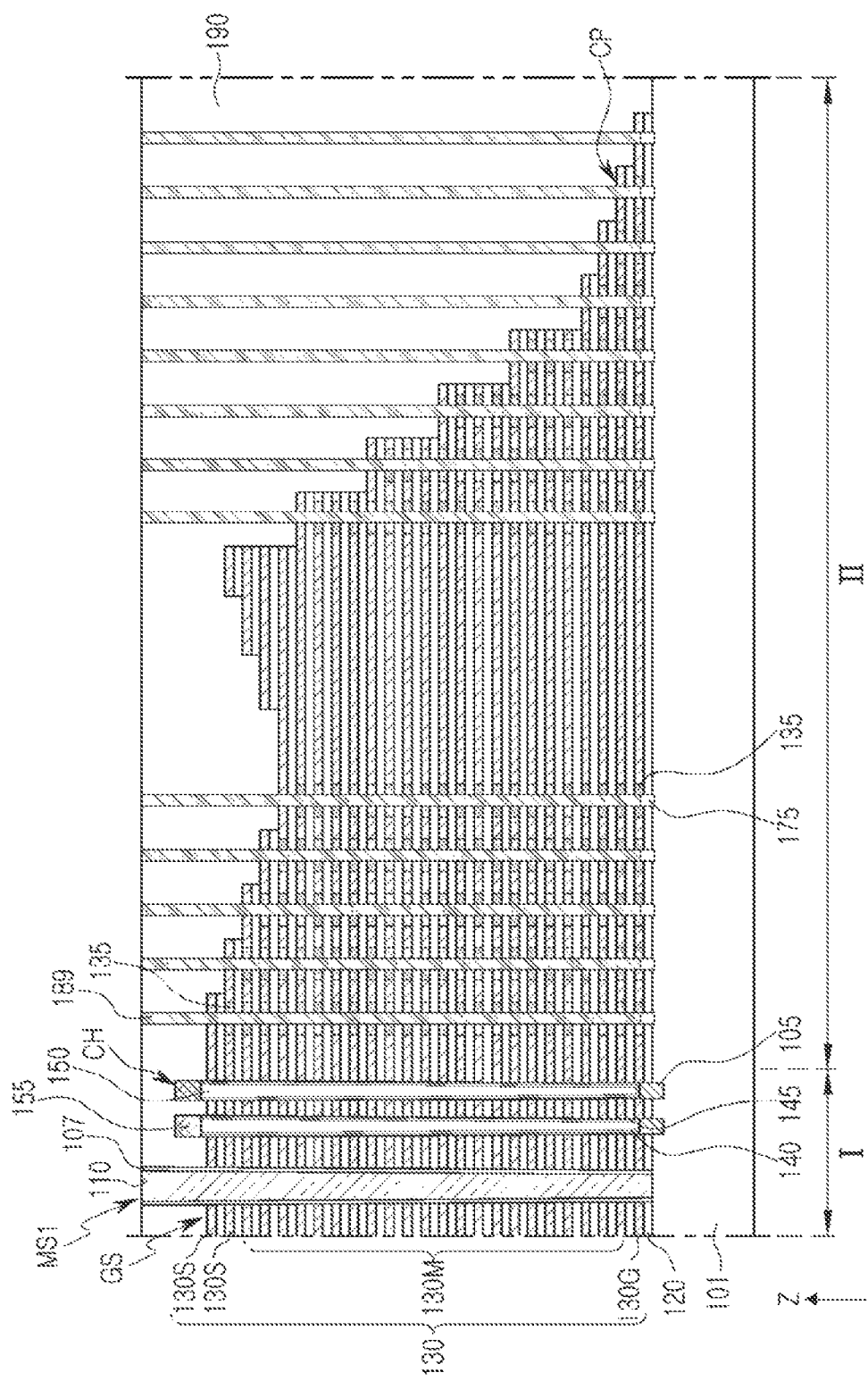

Referring to FIG. 13J, the second tunnel portions LT2, from which the sacrificial layers 180 and the impurity regions 185 are removed, may be filled with a conductive material to form gate electrodes 130, and the source insulating layer 107 and the source conductive layer 110 may be formed in the second openings OP2.

The conductive material is embedded in the second tunnel portions LT2, and may be formed to at least partially surround the insulating regions 135. The conductive material may contain metal, polycrystalline silicon, and/or a metal suicide material. After the gate electrodes 130, including the insulating regions 135 and other conductive regions, are formed, the conductive material, deposited in the second openings OP2, may be removed through an additional process.

The source insulating layer 107 may be formed in the form of a spacer in the second openings OP2. For example, after an insulating material is deposited, an insulating material, formed on the substrate 101, is removed from a lower portion of the second openings OP2 to form a source insulating layer 107.

Then, a conductive material is deposited on the source insulating layer 107 to form a source conductive layer 110. An upper surface of the source conductive layer 110 may be located on a level the same as a level of an upper surface of the sacrificial plugs 189. Thus, the upper surface of the source conductive layer may be located on a same level as an upper surface of the contact plugs 170 (see FIG. 4) through a subsequent process. The source insulating layer 107 and the source conductive layer 110 may be formed in the same process in the first separation regions MS1 and the second separation regions MS2a and MS2b, and may thus have the same structure. However, as described above, for example, the source conductive layer 110 in the first separation regions MS1 may function as the common source line CSL, and the source conductive layer 110 in the second separation regions MS2a and MS2b may function as the dummy common source line.

Figure 13K:
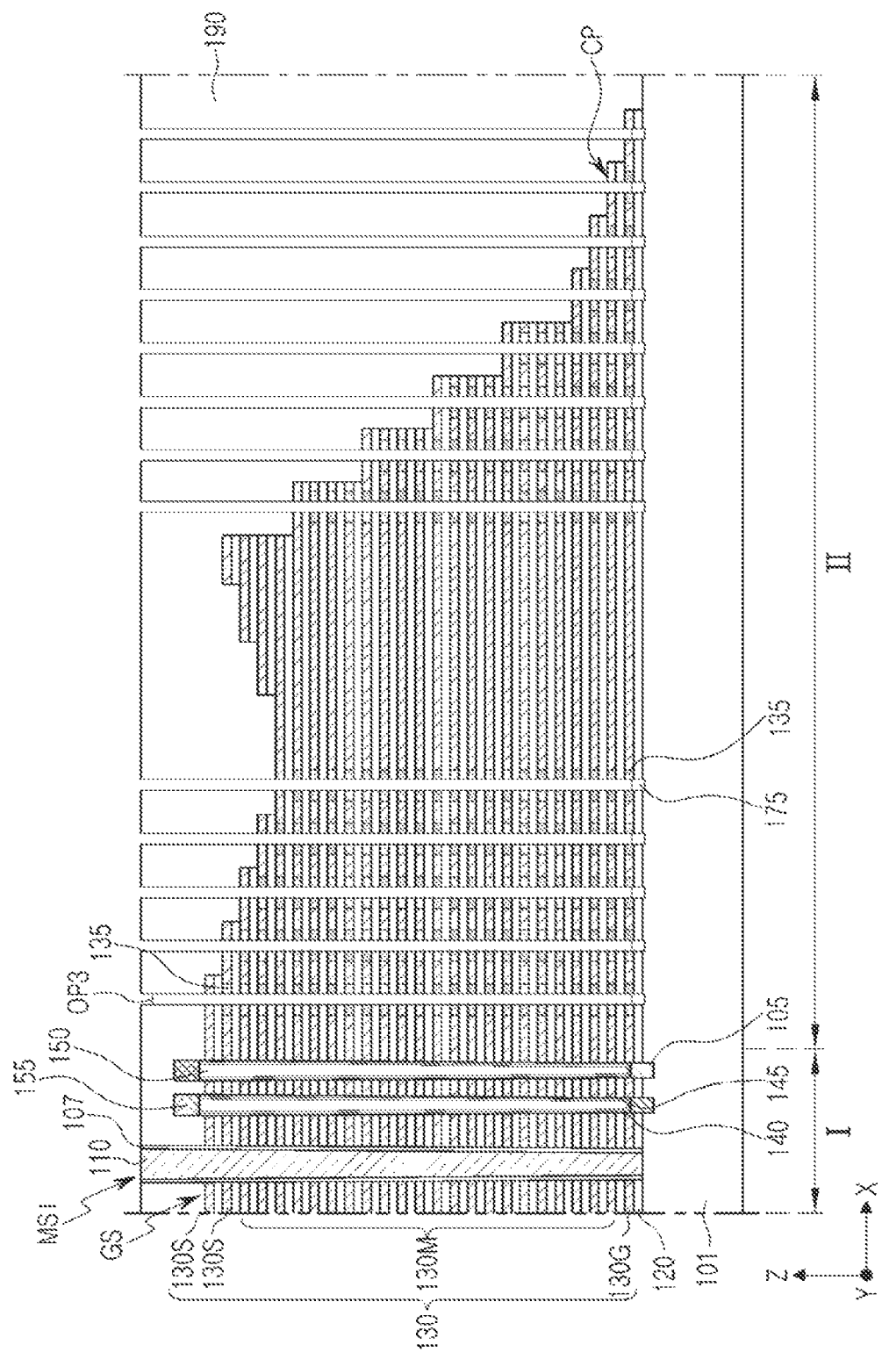

Referring to FIG. 13K, the sacrificial plugs 189 may be removed to form third openings OP3.

First, materials, deposited on an upper portion of the cell region insulating layer 190, may be removed using a planarization process, or the like, and sacrificial plugs 189 may be used as a stop layer during the planarization process.

The sacrificial plugs 189 may be removed using, for example, a wet etching process. When a portion of the gate dielectric layers 145 at least partially surrounds the gate electrodes 130, after the sacrificial plugs 189 are removed in the operation described above, a process for removing a portion of the gate dielectric layers 145 exposed through the third openings OP3 may be performed. Thus, the concave-convex portions P, described above with reference to FIGS. 6A and 6B, may be formed.

Then, as illustrated in FIG. 4, a conductive material is deposited in the third openings OP3 to the contact plugs 170. The conductive material may include a material the same as a material forming the gate electrodes 130, but is not limited thereto.

FIGS. 14A to 14E are schematic cross-sectional views illustrating a method for manufacturing a semiconductor device according to example embodiments of the present inventive concept. FIGS. 14A to 14E illustrate a region corresponding to FIG. 11A. Hereinafter, descriptions overlapping those of FIGS. 13A to 13K will be omitted and it may be assumed that the omitted details are at least similar to details of corresponding elements that have been described herein.

Figure 14A:
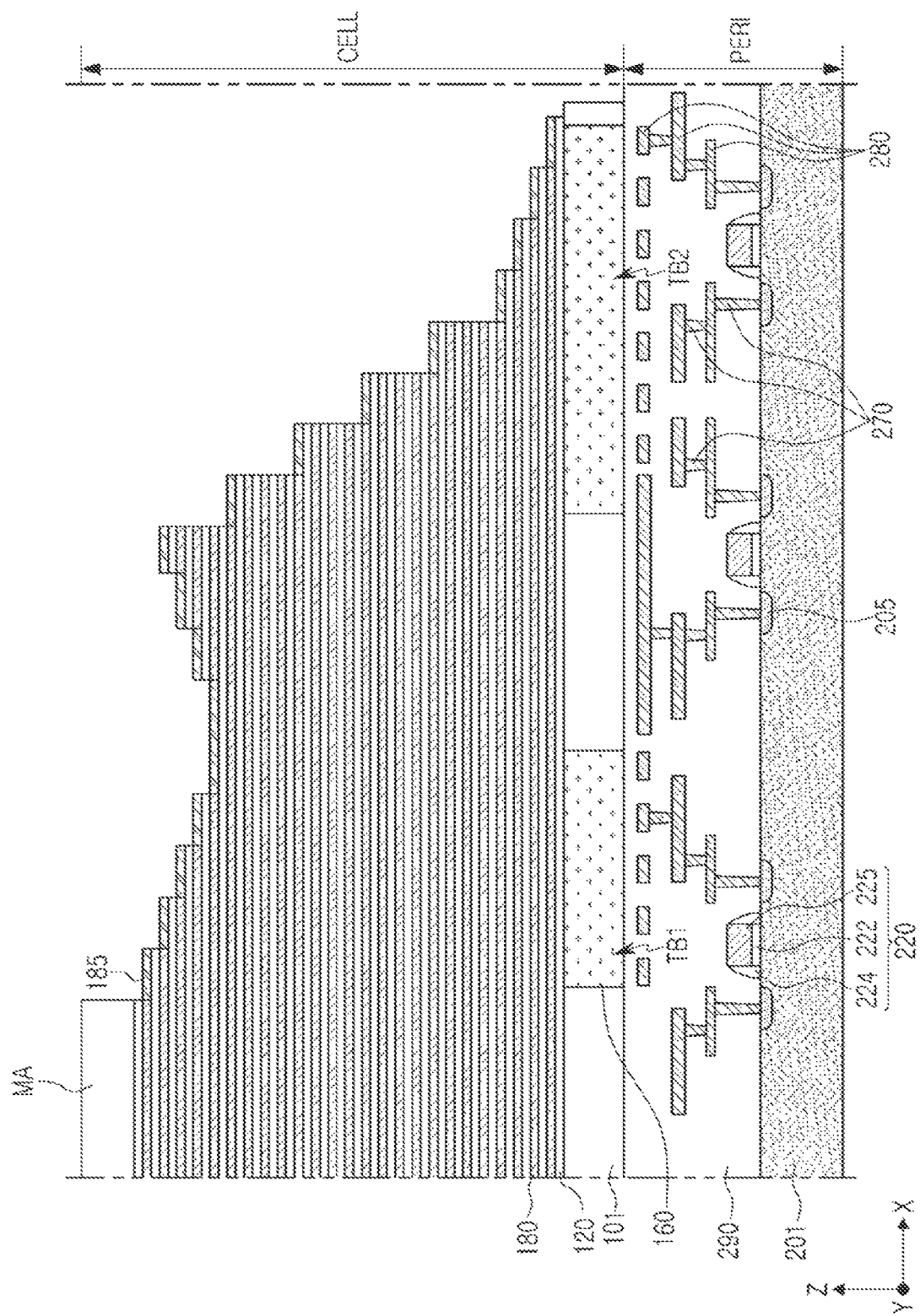
FIGS. 14A to 14E are schematic cross-sectional views illustrating a method for manufacturing a semiconductor device according to example embodiments of the present inventive concept.

Referring to FIG. 14A, after the peripheral circuit region PERI is formed, the substrate 101 of the memory cell region CELL and a stacked structure of the sacrificial layers 180 and the interlayer insulating layers 120, may be formed.

First, the peripheral circuit region PERI may be formed by forming circuit elements 220, circuit contact plugs 270, wiring lines 280, and a peripheral region insulating layer 290 on the base substrate 201.

Then, the substrate 101 may be formed on the peripheral circuit region PERI. In a region corresponding to the first wiring region TB1 and the second wiring region TB2, a material, forming the substrate 101, may be removed and an insulating, material may be embedded to form a through insulating layer 160.

Then, as described above with reference to FIGS. 13A and 13B, a stacked structure of the sacrificial layers 180 and the interlayer insulating layers 120 is formed, and an impurity is implanted to form impurity regions 185.

Figure 14B:
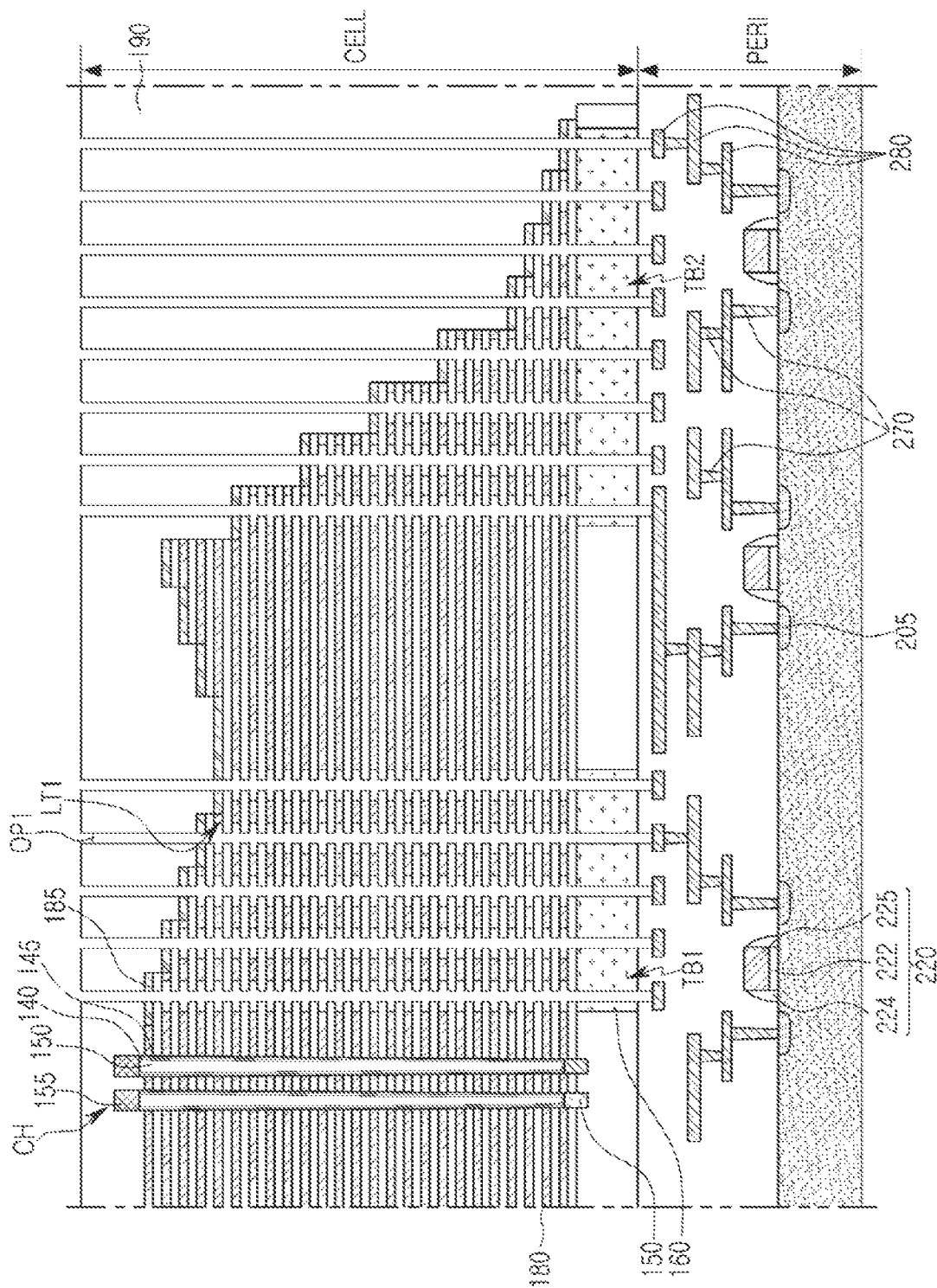

Referring to FIG. 14B, the channels CH passing through a stacked structure of the sacrificial layers 180 and the interlayer insulating layers 120, may be formed, and first openings OP1 are formed in a region in which the contact plugs 170 (see FIG. 11A) are to be formed. Then, a portion of the sacrificial layers 180, exposed through the first openings OP1, may be removed to form first tunnel portions LT1.

The first openings OP1 may be formed by anisotropically etching the stacked structure and the through insulating layer 160, and may have the form of a hole. The first openings OP1 may be formed to pass through the substrate 101 through the through insulating layer 160 and to allow some regions of the wiring lines 280 of the peripheral circuit region PERI to be exposed.

Figure 14C:
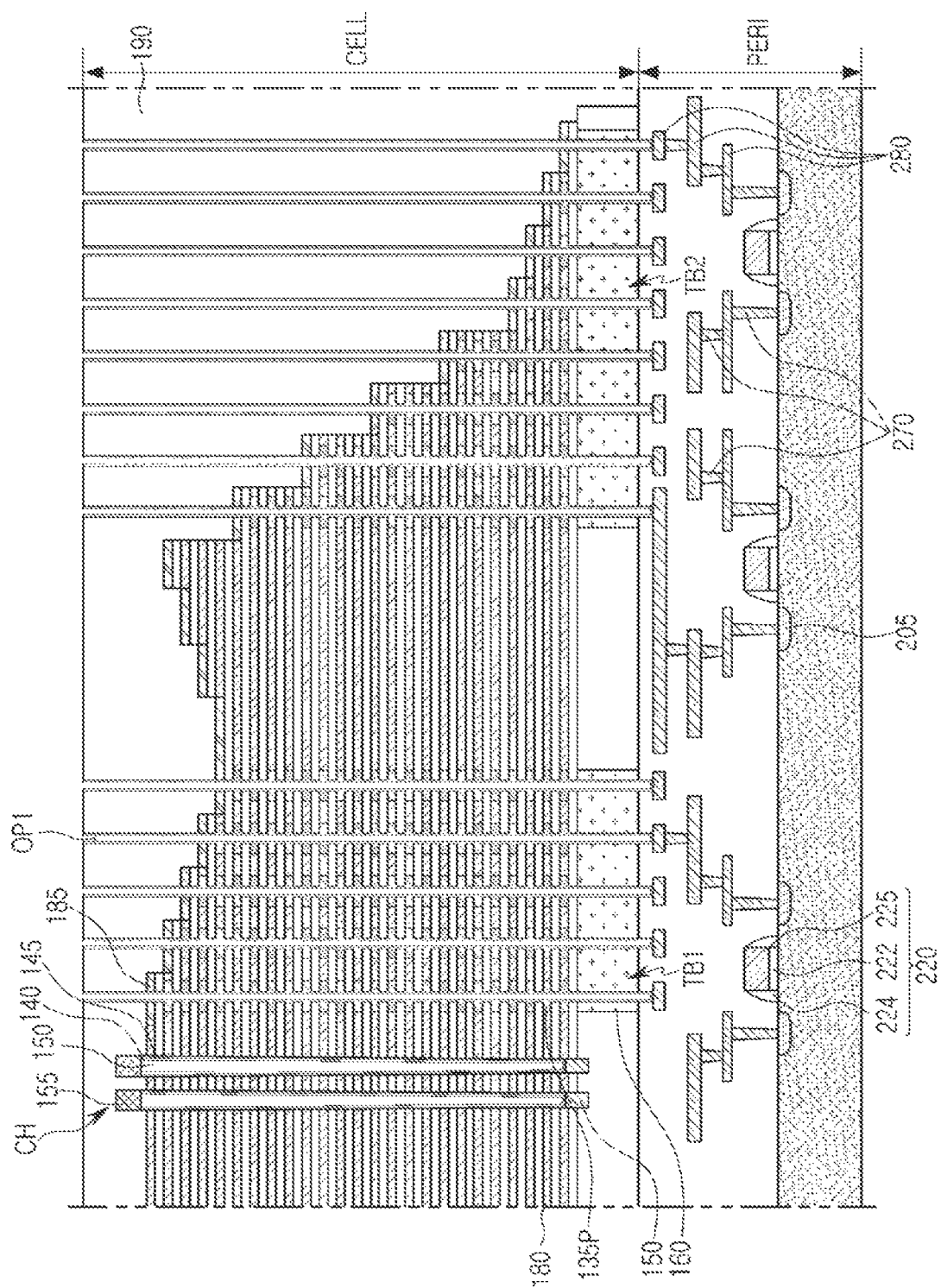

Referring to FIG. 14C, an insulating region material 135P may be deposited in the first openings OP1 and the first tunnel portions LT1.

The insulating region material 135P may fill the first tunnel portions LT1 and may be deposited on a side wall of the first openings OP1. The insulating region material 135P may be a layer on which the insulating regions 135 of FIG. 11A is ultimately formed through a subsequent process. The insulating region material 135P may be deposited with a uniform thickness along a lower surface of the first openings OP1, at a lower end of the first openings OP1.

Figure 14D:
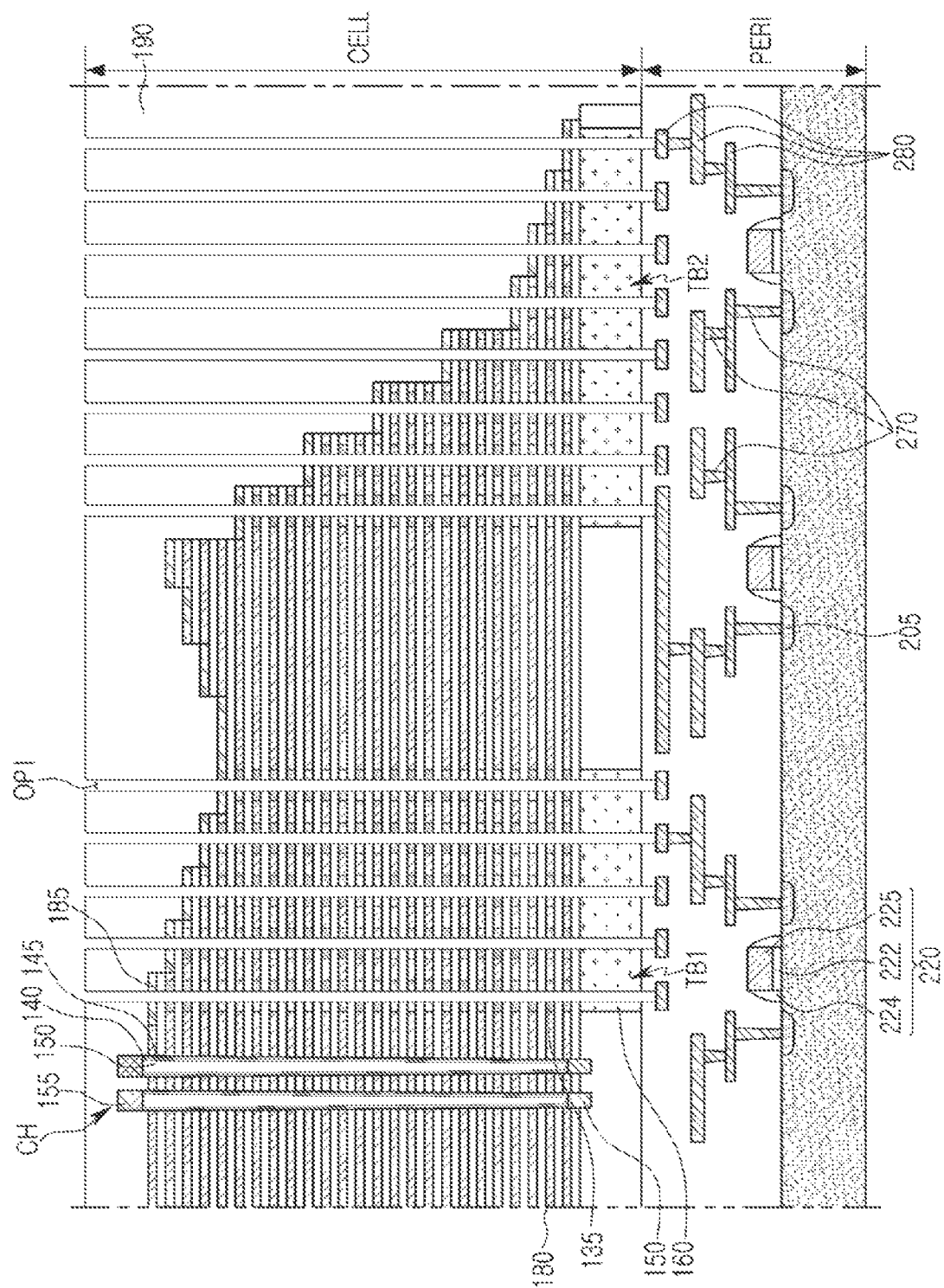

Referring to FIG. 14d, a portion of the insulating region material 135P may be removed from the first openings OP1, thereby forming insulating regions 135.

A removal process of the insulating region material 135P may be performed in a manner similar to that described with reference to FIG. 13G. Due to the removal process, an insulating region material 135P may be removed from a side wall of the first openings OP1, and the insulating region material 135P may be completely removed from the wiring lines 280 to expose an upper surface of the wiring lines 280 at a lower end of the first openings OP1.

Figure 14E:
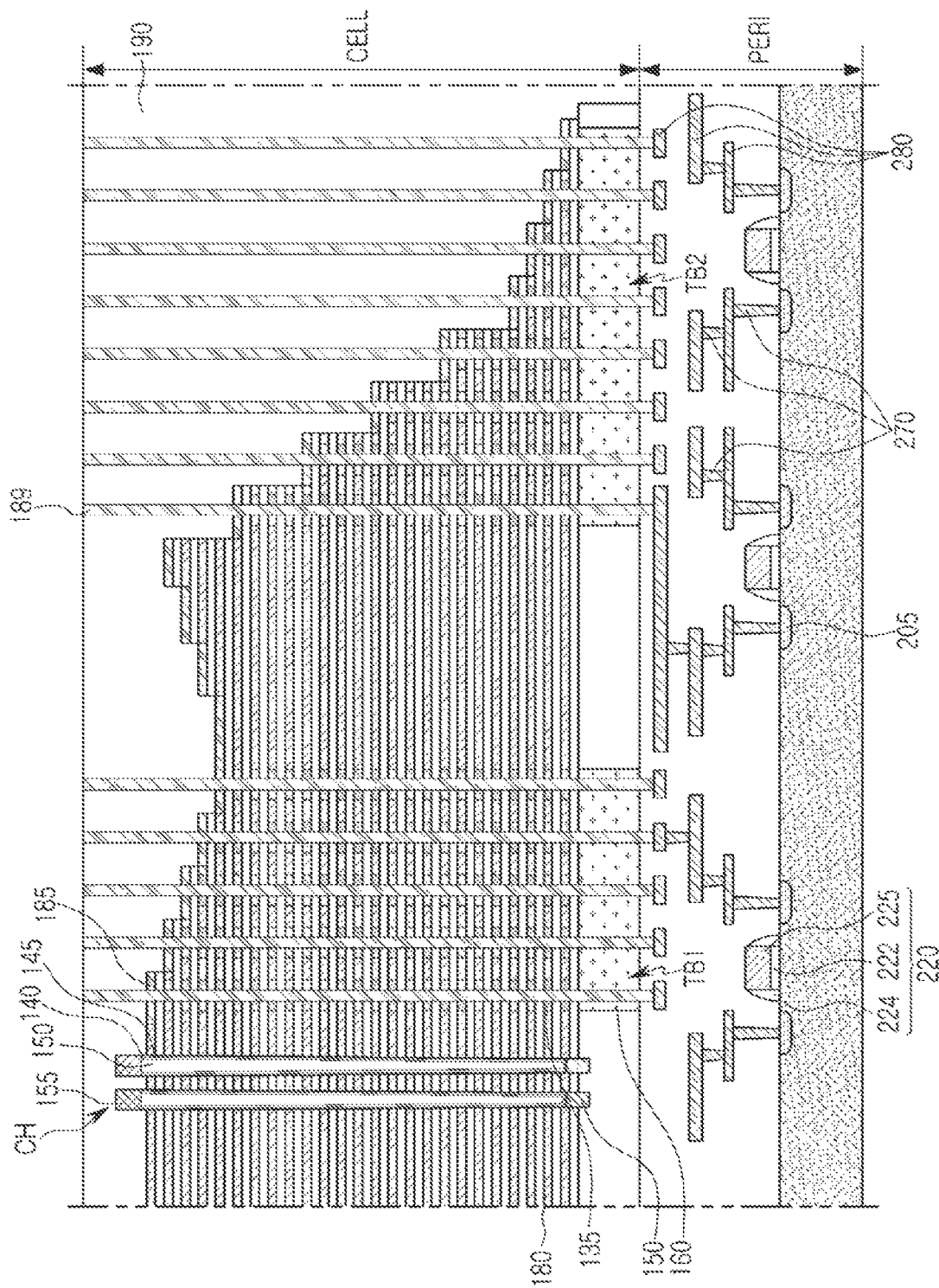

Referring to FIG. 14E, the first openings OP1 may be filled with a material to form sacrificial plugs 189.

A formation process of the sacrificial plugs 189 may be performed in a manner similar to that described with reference to FIG. 13H. However, the sacrificial plugs 189 may be in contact with the wiring lines 280 at a lower end of the first openings OP1.

Next, operations described above with reference to FIGS. 13I to 13K may be performed in the same manner.

Figure 15:
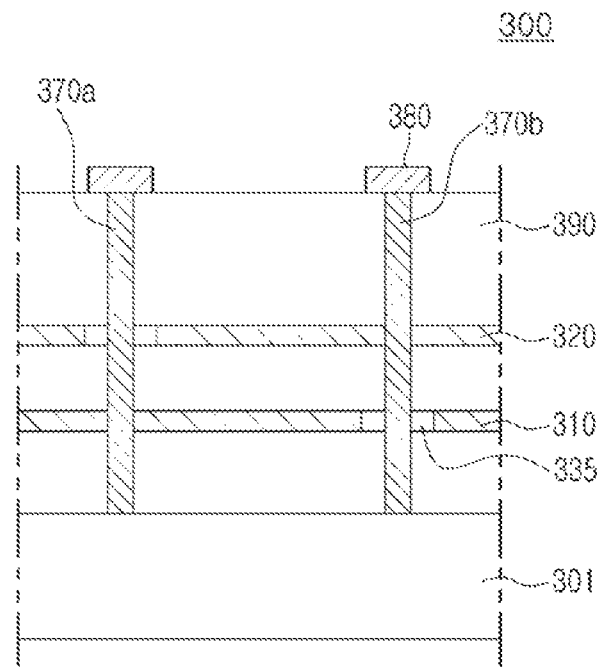
FIG. 15 is a schematic cross-sectional view illustrating a semiconductor device according to example embodiments of the present inventive concept.

FIG. 15 is a schematic cross-sectional view illustrating a semiconductor device according to example embodiments of the present inventive concept.

Referring to FIG. 15, a semiconductor device 300 may include a substrate 301. An interlayer insulating layer 390 is disposed on the substrate 301. First and second conductive layers 310 and 320 are disposed in the interlayer insulating layer 390. First and second contact layers 370a and 370b pass through the first and second conductive layers 310 and 320. Insulating regions 335 are disposed between the first and second contact layers 370a and 370b and the first and second conductive layers 310 and 320. Wiring layers 380 are disposed on the first and second contact layers 370a and 370b.

The substrate 301 may be a semiconductor substrate or the substrate 301 may include a circuit element already formed on a semiconductor. The interlayer insulating layer 390 may be a layer covering the first and second conductive layers 310 and 320 as well as the first and second contact layers 370a and 370b. A circuit element and/or wiring layers may be further disposed in the interlayer insulating layer 390.

The first and second conductive layers 310 and 320 may be vertically disposed on the substrate 101 and may extend in parallel to each other. The first and second conductive layers 310 and 320 may form active regions or conductive lines of the semiconductor device 300. The conductive lines may be, for example, word lines and/or bit lines. Depending on a type of the semiconductor device 300, a size and arrangement of the first and second conductive layers 310 and 320 may be variously changed.

The first and second contact layers 370a and 370b may pass through the interlayer insulating layer 390 as well as the first and second conductive layers 310 and 320, and each of the first and second contact layers 370a and 370b may be electrically connected to one of the first and second conductive layers 310 and 320. The first and second contact layers 370a and 370b may the same height each other and may be connected to the first conductive layers 310 and 320 disposed on different levels, respectively. The first and second contact layers 370a and 370b may be directly connected to the substrate 301 at lower ends, or may be connected to an insulating layer on the substrate 301.

The first contact layer 370a may pass through the first conductive layer 310, and may be in contact with the first conductive layer 310 through a side surface and electrically connected thereto. The first contact layer 370a may be electrically isolated from the second conductive layer 320 by an insulating region 335 disposed between the first contact layer and the second conductive layer 320. The second contact layer 370b may pass through the second conductive layer 320, and may be in contact with the second conductive layer 320 through a side surface and electrically connected thereto. The second contact layer 370b may be electrically isolated from the first conductive layer 310 by an insulating region 335 disposed between the second contact layer and the first conductive layer 310.

The insulating region 335 may be disposed between each of the first and second conductive layers 310 and 320 at a circumference of each of the first and second contact layers 370a and 370b. The insulating region 335 may have a shape such as an annular shape, a quadrangle shape, or the like, at least partially surrounding the first and second contact layers 370a and 370b on a plane. The insulating region 335 may be arranged horizontally side by side with the same thickness as those of the first and second conductive layers 310 and 320, but other arrangements may be used. According to example embodiments of the present inventive concept, the insulating region 335 may be thicker than the first and second conductive layers 310 and 320.

Figure 16:
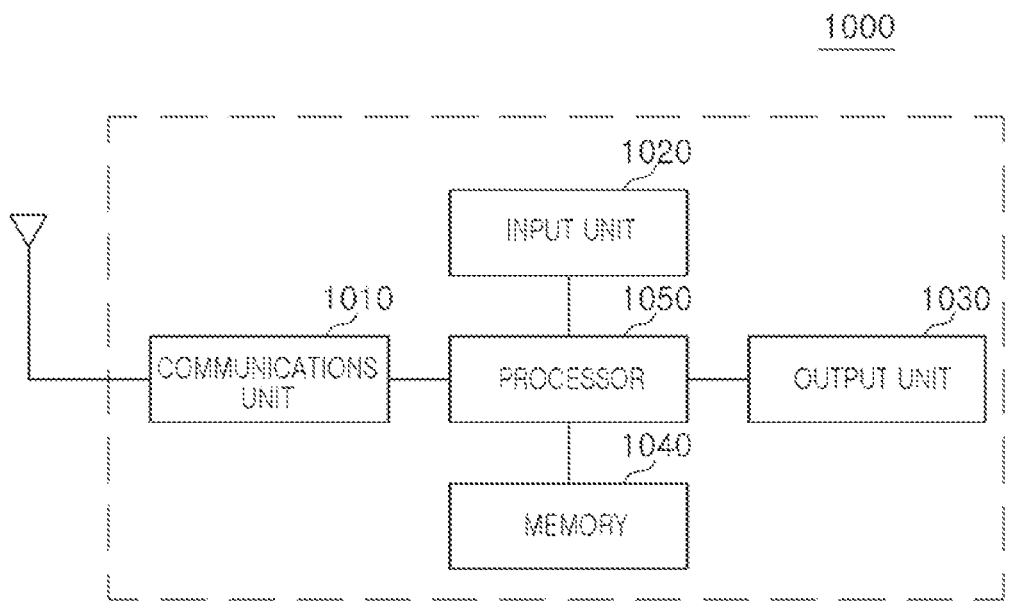
FIG. 16 is a block diagram illustrating an electronic device including a semiconductor device according to example embodiments of the present inventive concept.

FIG. 16 is a block diagram illustrating an electronic device including a semiconductor device according to example embodiments of the present inventive concept.

Referring to FIG. 16, an electronic device 1000, according to an example embodiment of the present disclosure, may include a communications unit 1010, an input unit 1020, an output unit 1030, a memory 1040, and a processor 1050.

The communications unit 1010 may include a wired/wireless communications module such as a wireless Internet module, a local communications module, a global positioning system (GPS) module, or a mobile communications module. The wired/wireless communications module included in the communications unit 1010 may be connected to an external communications network using one or more of various communications standards to transmit and receive data. The input unit 1020 may include a mechanical switch, a touchscreen, a voice recognition module, and the like, as a module provided for a user to control operations of the electronic device 1000, and may further include various sensor modules to which a user may input data. The output unit 1030 may output information processed by the electronic device 1000 in an audio or video format, and the memory 1040 may store a program for processing or control of the processor 1050, or data. The memory 1040 may include one or more semiconductor devices according to various example embodiments of the present inventive concept as described above with reference to FIGS. 3 to 12, and may be embedded in the electronic device 1000 or may communicate with the processor 1050 through a separate interface. The processor 1050 may control operations of each component included in the electronic device 1000. The processor 1050 may perform control and processing associated with a voice call, a video call, data communications, and the like, or may conduct control and processing for multimedia reproduction and management. Moreover, the processor 1050 may process the input from a user via the input unit 1020 and output the result thereof through the output unit 1030, and may store data, required for controlling an operation of the electronic device 1000, in the memory 1040 or retrieve the data from the memory 1040.

As set forth above, according to example embodiments of the present inventive concept of the present inventive concept, a semiconductor device with a high degree of reliability, may be achieved by allowing contact plugs to pass through the entirety of gate electrodes.

Moreover, a manufacturing method capable of manufacturing a semiconductor device with a high degree of reliability, may include forming contact plugs passing through the entirety of gate electrodes, in the manner described herein.

While example embodiments of the present inventive concept have been shown and described above, it will be apparent to those skilled in the art that modifications and variations could be made without departing from the scope of the present disclosure.

What is claimed is:

1. A semiconductor device, comprising:
   a plurality of gate electrodes stacked and spaced apart from each other in a direction perpendicular to an upper surface of a substrate, the plurality of gate electrodes extending in different lengths from each other in one direction to provide a plurality of contact regions, and each of the plurality of gate electrodes having a conductive region and an insulating region, the insulating region being an insulating ring surrounded by the conductive region; and
   a plurality of contact plugs filling contact holes that pass through an entirety of the plurality of gate electrodes stacked on the substrate in the contact regions,
   wherein a first group of the plurality of contact plugs are electrically connected to a first group of the plurality of gate electrodes by direct contact between members of the first group of the plurality of contact plugs and the conductive region of corresponding members of the first group of the plurality of gate electrodes, and
   wherein a second group of the plurality of contact plugs are electrically insulated from a second group of the plurality of gate electrodes by a disposition of the insulating region of members of the second group of the plurality of gate electrodes that is between the conductive region of the members of the second group of the plurality of gate electrodes and corresponding members of the second group of the plurality of contact plugs.

2. The semiconductor device of claim 1, wherein the insulating region of each of the plurality of gate electrodes has a top surface that is planar with respect to a corresponding top surface of the conductive region of each of the plurality of gate electrodes and has a bottom surface that is planar with respect to a corresponding bottom surface of the conductive region of each of the plurality of gate electrodes.

3. The semiconductor device of claim 1, wherein each contact plug of the plurality of contact plugs is in contact with the conductive region of a corresponding gate electrode of the plurality of gate electrodes through an external side surface thereof.

4. The semiconductor device of claim 1, further comprising:
   a plurality of interlayer insulating layers alternately stacked with the plurality of gate electrodes on the substrate,
   wherein each of the plurality of contact plugs passes through one of the gate electrodes of the plurality of gate electrodes and passes through at least one of the plurality of interlayer insulating layers that is in contact with a corresponding gate electrode of the plurality of gate electrodes, with substantially the same width.

5. The semiconductor device of claim 1, wherein each of the plurality of contact plugs has a width equal to a width of the contact holes.

6. The semiconductor device of claim 1, wherein the plurality of contact plugs pass through at least a portion of the gate electrode among the plurality of gate electrodes in a lowermost portion.

7. The semiconductor device of claim 1, wherein at least portions of the plurality of contact plugs pass through portions of the plurality of gate electrodes without passing through at least one of the plurality of gate electrodes adjacent to the substrate.

8. The semiconductor device of claim 1, wherein each of the plurality of contact plugs has a region protruding outwardly toward the conductive region and the insulating region in a region in contact with the plurality of gate electrodes.

9. The semiconductor device of claim 8, further comprising:
a plurality of interlayer insulating layers alternately stacked with the gate electrodes on the substrate,
wherein each of the plurality of contact plugs passes through the plurality of interlayer insulating layers, and interfaces between the plurality of contact plugs and the plurality of the insulating regions of the plurality of gate electrodes are located outwardly, based on interfaces between the plurality of contact plugs and the plurality of interlayer insulating layers.

10. The semiconductor device of claim 1, wherein different portions of the plurality of contact plugs have different lengths in the direction perpendicular to the substrate.

11. The semiconductor device of claim 1, further comprising:
a substrate insulating layer disposed between each of the plurality of contact plugs and the substrate.

12. The semiconductor device of claim 1, further comprising:
a source conductive layer passing through the plurality of gate electrodes and extended in one direction, wherein an upper surface of the source conductive layer is located on substantially a same level as upper surfaces of the plurality of contact plugs.

13. The semiconductor device of claim 1, wherein a distance from an edge of the conductive region of the one gate electrode to a corresponding one of the contact holes is different from a distance from an edge of the conductive region of each of the other gate electrodes to a corresponding one of the contact holes.

14. A semiconductor device, comprising:
a plurality of gate conductive regions spaced apart from each other and stacked in a direction perpendicular to an upper surface of a substrate, the plurality of gate conductive regions including a first gate conductive region and a plurality of second gate conductive regions;
a plurality of gate insulating regions, each of which is at least partially surrounded by a corresponding gate conductive region of the plurality of gate conductive regions, wherein the plurality of gate insulating regions occupy substantially a same level as a corresponding gate conductive region of the plurality of gate conductive regions; and
a contact plug fills a contact hole passing through one of the plurality of gate conductive regions and the plurality of gate insulating regions, and is electrically connected to the one of the plurality of gate conductive regions,
wherein the contact plug passes through the first gate conductive region and the gate insulating regions surrounded by the plurality of second gate conductive regions, and
wherein a distance from an adjacent edge of the first gate conductive region to the contact hole is different from a distance from an adjacent edge of each of the plurality of second gate conductive regions to the contact hole.

15. The semiconductor device of claim 14, wherein the plurality of gate insulating regions are arranged in a single row along the contact plug, in the direction perpendicular to the substrate.

16. The semiconductor device of claim 14, wherein the adjacent edge of the first gate conductive region is in contact with the contact plug and the adjacent edge of each of the plurality of second gate conductive regions is spaced apart from the contact plug.

17. The semiconductor device of claim 14, wherein each of the plurality of gate insulating regions is disposed outside of the contact hole in a region in which the plurality of gate conductive regions intersect the contact plug.

18. A semiconductor device, comprising:
a substrate having a first region and a second region;
a plurality of gate conductive regions spaced apart from each other and stacked in a direction perpendicular to an upper surface of a substrate, the plurality of gate conductive regions including a first gate conductive region and a plurality of second gate conductive regions;
a plurality of gate insulating regions, each of which is at least partially surrounded by a corresponding gate conductive region of the plurality of gate conductive regions, wherein the plurality of gate insulating regions occupy substantially a same level as a corresponding gate conductive region of the plurality of gate conductive regions;
a plurality of channels disposed in the first region of the substrate, passing through the plurality of gate conductive regions, and each including a channel region having an annular form; and
a contact plug disposed in the second region of the substrate, filling a contact hole passing through one of the plurality of gate conductive regions and the plurality of gate insulating regions, and being electrically connected to the one of the plurality of gate conductive regions,
wherein the contact plug passes through the first gate conductive region and the gate insulating regions surrounded by the plurality of second gate conductive regions.

19. The semiconductor device of claim 18, wherein the plurality of gate insulating regions are vertically spaced apart from each other.

20. The semiconductor device of claim 18, further comprising:
a substrate insulating layer disposed between the contact plug and the substrate.

* * * * *